(12) United States Patent
Furuta et al.

(10) Patent No.: US 12,222,660 B2
(45) Date of Patent: Feb. 11, 2025

(54) LIGHT EMITTING DEVICE AND IMAGE FORMING APPARATUS INCLUDING LIGHT EMITTING DEVICE

(71) Applicant: CANON KABUSHIKI KAISHA, Tokyo (JP)

(72) Inventors: Yasutomo Furuta, Chiba (JP); Takahisa Ono, Kanagawa (JP); Hayato Koyama, Chiba (JP); Hidefumi Yoshida, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 18/120,469

(22) Filed: Mar. 13, 2023

(65) Prior Publication Data

US 2023/0213877 A1  Jul. 6, 2023

Related U.S. Application Data

(60) Division of application No. 17/584,516, filed on Jan. 26, 2022, now Pat. No. 11,635,703, which is a (Continued)

(30) Foreign Application Priority Data

Aug. 23, 2019 (JP) ................ 2019-152969
Aug. 23, 2019 (JP) ................ 2019-152970
Jul. 21, 2020 (JP) ................ 2020-124707

(51) Int. Cl.
*G03G 15/043* (2006.01)
*G03G 15/04* (2006.01)
(Continued)

(52) U.S. Cl.
CPC ..... *G03G 15/04054* (2013.01); *G03G 15/041* (2013.01); *G03G 15/043* (2013.01);
(Continued)

(58) Field of Classification Search
CPC ....... G03G 15/043; G03G 15/04; B41J 2/435; B41J 2/385; B41J 2/47; B41J 2/447;
(Continued)

(56) References Cited

U.S. PATENT DOCUMENTS 5,008,607 A   4/1991   Ono et al.
5,043,715 A   8/1991   Kun et al.
(Continued)

FOREIGN PATENT DOCUMENTS

JP   2007-081081 A   3/2007
JP   2011-024004 A   2/2011
(Continued)

*Primary Examiner* — John Zimmermann
(74) *Attorney, Agent, or Firm* — Venable LLP

(57) ABSTRACT

A light emitting device 401 includes a silicon substrate and a light emitting region including a lower electrode, a light emitting layer, and an upper electrode, and an exposure head is provided with a printed board on which light emitting devices 401 are arranged in a staggered form and a circuit portion 602 for controlling, on the basis of image data, a voltage of each of electrodes included in the lower electrode so that the light emitting device layer emits light and is for forming an image with a resolution corresponding to an arrangement interval of the lower electrode with respect to a crossing direction, and the circuit portion 602 is disposed (Continued)

together with the light emitting region on the silicon substrate. Costs on wire bonding and an area of a wiring board can be suppressed.

15 Claims, 24 Drawing Sheets

Related U.S. Application Data continuation of application No. PCT/JP2020/030287, filed on Jul. 31, 2020.

(51) Int. Cl.
  *G03G 15/041* (2006.01)
  *B41J 2/447* (2006.01)
  *B41J 2/45* (2006.01)
  *H10K 50/00* (2023.01)

(52) U.S. Cl.
  CPC ............... *B41J 2/447* (2013.01); *B41J 2/45* (2013.01); *G03G 2215/0409* (2013.01); *H10K 50/00* (2023.02)

(58) Field of Classification Search
  CPC ......... G03B 27/72; H01L 21/02; H01L 23/48; G02F 1/1343
  See application file for complete search history.

(56) References Cited

U.S. PATENT DOCUMENTS

| | | |
|---|---|---|
| 5,239,576 A | 8/1993 | Yoshida et al. |
| 5,586,131 A | 12/1996 | Ono |
| 5,699,366 A | 12/1997 | Ono |
| 10,471,734 B2 | 11/2019 | Kondo |
| 10,921,727 B2 | 2/2021 | Yoshida |
| 11,079,699 B2 | 8/2021 | Furuta |
| 2006/0028534 A1* | 2/2006 | Kobayashi ............... B41J 2/435 347/238 |
| 2007/0057259 A1 | 3/2007 | Nagumo |
| 2010/0141731 A1 | 6/2010 | Ko et al. |
| 2011/0103838 A1 | 5/2011 | Tutt et al. |
| 2013/0193419 A1 | 8/2013 | Mizuno |
| 2018/0309890 A1 | 10/2018 | Kondo |
| 2021/0055669 A1 | 2/2021 | Yoshida et al. |
| 2022/0171308 A1 | 6/2022 | Koyama et al. |
| 2022/0197176 A1* | 6/2022 | Nakanishi ............ G03G 15/043 |

FOREIGN PATENT DOCUMENTS

| | | |
|---|---|---|
| JP | 2013-157226 A | 8/2013 |
| JP | 2017-183436 A | 10/2017 |

\* cited by examiner

LIGHT EMITTING DEVICE AND IMAGE FORMING APPARATUS INCLUDING LIGHT EMITTING DEVICE

TECHNICAL FIELD

The present invention relates to a light emitting device and an image forming apparatus, and particularly relates to a printer of an electrophotographic type.

BACKGROUND ART

In a printer which is an image forming apparatus of the electrophotographic type, a type is generally known in which an exposure head is used to exposure a photosensitive drum to light to form a latent image. Here, for the exposure head, an LED (Light Emitting Diode) or an organic EL (Organic Electro Luminescence), for example is used. The exposure head is constituted by a light emitting element array extended in a longitudinal direction of a photosensitive drum, and a rod lens array for forming an image of light from the light emitting element array, on the photosensitive drum. A constitution in which the LED or the organic EL has a planar emitting shape in which the emitting direction of light from a light emitting surface is in the same direction as the rod lens array. Here, the length of the light emitting element array is determined depending on a width of an image area on the photosensitive drum, and an interval between the light emitting elements is determined depending on a resolution of the printer. For example, in the case of a 1200 dpi printer, the pixel interval is 21.16 μm, and therefore the interval between the light emitting elements is also an interval corresponding to 21.16 μm. In a printer using such an exposure head, the number of parts used is smaller than that of a laser scanning type printer in which the laser beam is scanned by a laser beam which is deflected by a rotating polygonal mirror, and therefore, it is easy to downsize the device and reduce the cost.

Japanese Laid-open Patent Application No. 2017-183436 discloses an exposure head in which a light emitting chip and a signal generating circuit as a driving circuit for driving the light emitting chip are individually mounted on a circuit board. The signal generating circuit causes a light emitting element of the light emitting chip to emit light by sending a light emitting signal to the light emitting chip via wiring on a printed board.

Problem to be Solved by the Invention

An object is to improve a structure of the light emitting chip and the driving circuit where are disclosed by the Japanese Laid-Open Application No. 2017-183436.

Means for Solving the Problem

In order to solve the above-described problem, the present invention is provided with the following constitutions.
(1) An image forming apparatus comprising: a photosensitive member for being rotationally driven about a rotational axis; an exposure head including a light emitting device, a circuit board on which the light emitting device is mounted, and a lens array for guiding light, emitted from the light emitting device, to a photosensitive member surface; and a controller for outputting image data for driving the light emitting device, to the circuit board, wherein the light emitting device comprises: a silicon wafer including a driving circuit for driving the light emitting device; and a laminar member including a first electrode layer which includes a plurality of electrodes arranged in a direction substantially parallel to the rotational axis of aid photosensitive member, a second electrode layer through which light is transmittable and which is laminar, and a light emitting layer formed in a layer between the first electrode layer and the second electrode layer and for emitting light by application of a voltage, the laminar member being formed on a surface of the silicon wafer, wherein the driving circuit includes a voltage generating circuit for generating a driving voltage and a pulse signal generating circuit for generating a pulse signal for each of the plurality of electrodes on the basis of the image data, and the driving circuit applies the driving voltage, generated by the voltage generating circuit, to each of the plurality of electrodes depending on the pulse signal.
(2) A light emitting device comprising: a silicon wafer including a circuit; and a laminar member including a first electrode layer which includes a plurality of electrodes, a second electrode layer through which light is transmittable and which is laminar, and a light emitting layer formed in a layer between the first electrode layer and the second electrode layer and for emitting light by application of a voltage, the laminar member being formed on a surface of the silicon wafer, wherein the driving circuit includes a voltage generating circuit for generating a driving voltage and a pulse signal generating circuit for generating a pulse signal for each of the plurality of electrodes on the basis of driving data, and the driving circuit applies the driving voltage, generated by the voltage generating circuit, to each of the plurality of electrodes depending on the pulse signal.

EMBODIMENTS FOR CARRYING OUT THE INVENTION

In the following, detailed description of an embodiment of the present invention will be made with reference to the drawings.

Embodiment 1

[Structure of Image Forming Apparatus]

Figure 1:
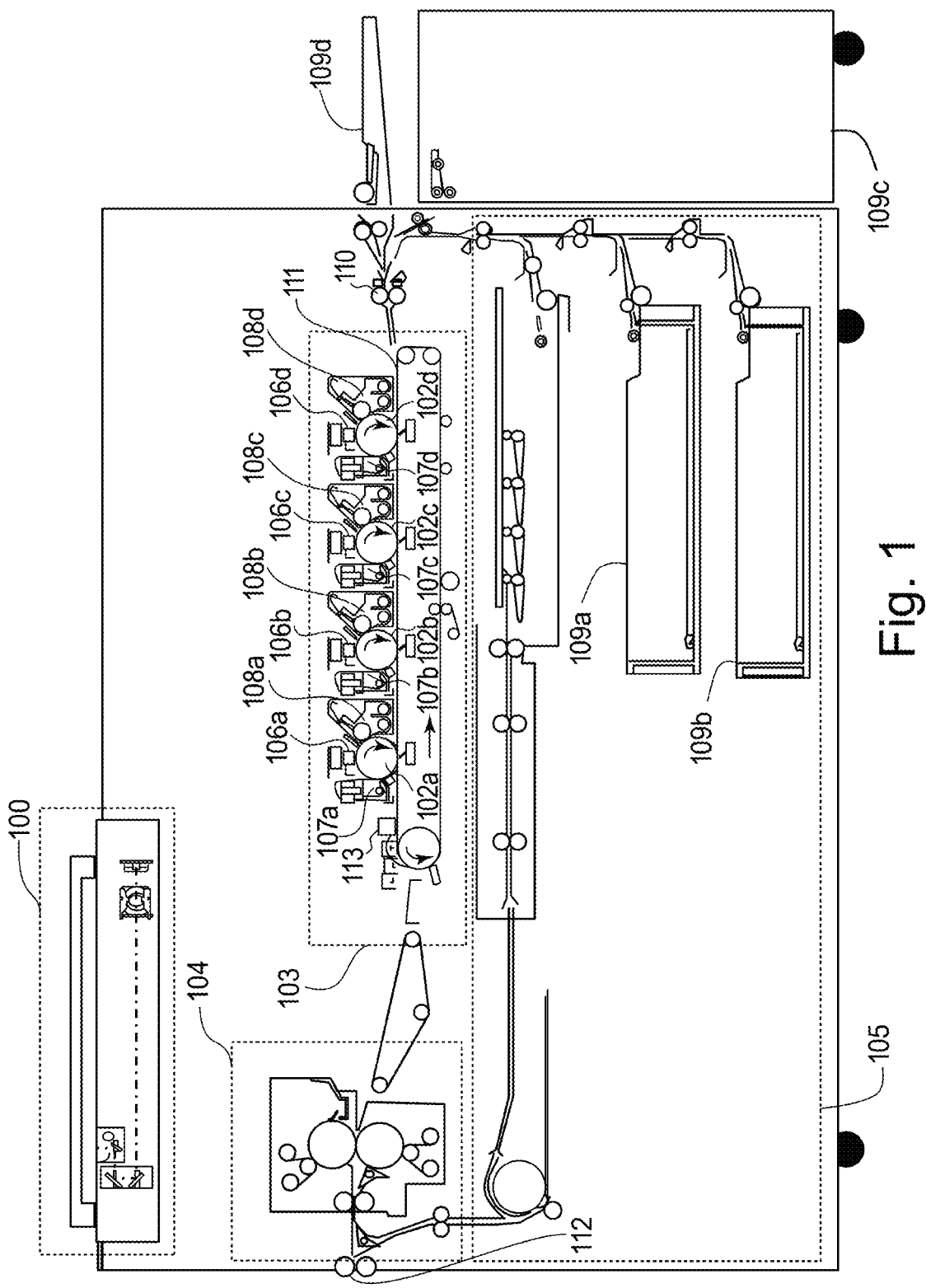
FIG. 1 is a diagram showing a structure of an image forming apparatus.

FIG. 1 is a schematic sectional view showing a structure of an electrophotographic image forming apparatus in an embodiment 1. The image forming apparatus shown in FIG. 1 is a multi-function machine (MFP) having a scanner function and a printer function, and is constituted by a scanner portion 100, an image forming portion 103, a fixing portion 104, a sheet feeding/conveying portion 105, and a printer control portion (not shown) which controls these portions. The scanner portion 100 illuminates an original placed on an original table, optically reads an original image and converts the read image into an electrical signal, so that image data is prepared.

The image forming portion 103 includes four continuous image forming stations arranged so that: cyan (C), magenta (M), yellow (Y), black (K) are arranged along a rotational direction (counterclockwise direction) of an endless conveying belt 111. The four image forming stations have the same structure, and each image forming station includes a photosensitive drum 102 rotatable in an arrow direction (clockwise direction), an exposure head 106, a charging device 107 and a developing device 108. Incidentally, suffixes a, b, c and d of the photosensitive drum 102, the exposure head 106, the charging device 107, and the developing device 108 indicate that these members are constituent elements corresponding to black (K), yellow (Y), magenta (M), and cyan (C) of the image forming stations, respectively. Incidentally, in the following, the suffixes of the reference numerals will be omitted unless it refers to a specific photosensitive drum or the like.

In the image forming portion 103, the photosensitive drum 102 is rotationally driven, and the photosensitive drum 102 is electrically charged by the charging device 107. The exposure head 106, which is an exposure means, causes a light emitting device to emit light depending on image data, and focuses the light generated by a light emitting device on the photosensitive drum 102 (on a photosensitive member) by a rod lens array, so that an electrostatic latent image is formed. The developing device 108, which is a developing means, develops the electrostatic latent image formed on the photosensitive drum 102 with toner. The developed toner image is transferred onto a recording sheet (paper) conveying belt 111 that conveys the recording sheet. A series of such electrophotographic processes are executed at each image forming station. Incidentally, at the time of image formation, after a predetermined time has elapsed since image formation is started at the cyan (C) image forming station, image forming operations of the magenta (M), yellow (Y), and black (K) image forming stations are executed. By this, a full-color image is formed.

The image forming apparatus shown in FIG. 1 includes, as units for feeding recording sheet, in-body sheet feeding units 109a and 109b provided in the sheet feeding conveying unit 105, an external sheet feeding unit 109c which is a large-capacity sheet feeding unit, and a manual sheet feeding unit 109d. During image formation, the recording sheet is fed from a sheet feed unit designated in advance, and the recording sheet is fed to a registration roller 110. The registration roller 110 feeds the recording sheet to the conveying belt 111 at a timing when the toner image formed in the image forming portion 103 described above is to be transferred onto the recording sheet. The toner images formed on the photosensitive drums 102 of the respective image forming stations are sequentially transferred onto the recording sheet fed by the conveying belt 111. The recording sheet onto which the unfixed toner images are transferred is fed to the fixing portion 104. The fixing portion 104 has a heat source therein, such as a halogen heater, and fixes the toner images on the recording sheet by heating and pressing with using two rollers. The recording sheet on which the toner images have been fixed by the fixing portion 104 is discharged to an outside of the image forming apparatus by discharge rollers 112.

An optical sensor 113 as a detecting mean is provided at a position facing the conveying belt 111 on a downstream side, in a recording sheet conveying (feeding) direction, of the black (K) image forming station. In order to derive a color misregistration amount of the toner images between the image forming stations, the optical sensor 113 detects positions of the test images formed on the conveying belt 111. The color misregistration amount derived by the optical sensor 113 is notified to an image controller portion 700 (see FIG. 6) which will be described hereinafter, and an image position of each color is corrected so that a full-color toner image without color misregistration is transferred onto the recording sheet. Further, in response to an instruction from an MFP control portion (not shown) which controls the entire multifunction machine (MFP), a printer control portion (not shown) executes the image forming portion while controlling the scanner portion 100, the image forming portion 103, the fixing portion 104, and the sheet feeding/conveying portion 105, and the like which are described above.

Here, as an example of the electrophotographic image forming apparatus, the image forming apparatus of the type in which the toner image formed on the photosensitive drum 102 of each image forming station is directly transferred onto the recording sheet carried on the conveying belt 111 has been described. The present invention is not limited to such a printer which directly transfers the toner image on the photosensitive drum 102 onto recording sheet. For example, the present invention is applicable also to an image forming apparatus including a primary transfer portion where the toner image on the photosensitive drum 102 is transferred onto the intermediary transfer belt and a secondary transfer portion where the toner image on the intermediary transfer belt is transferred onto the recording sheet.

[Structure of Exposure Head]

Figure 2:
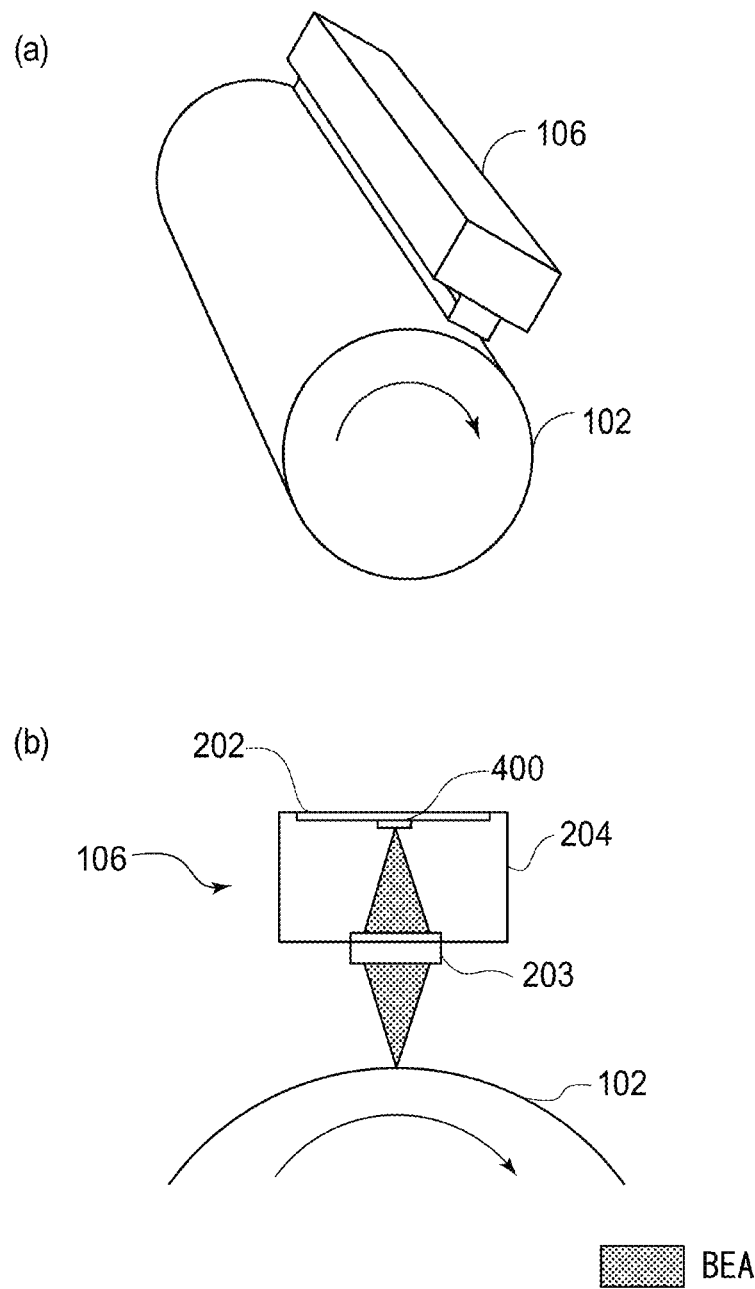
FIG. 2 includes diagrams showing a structure of an exposure head.

Referring to FIG. 2, the description will be made as to the exposure head 106 which exposes the photosensitive drum 102 to the (image) light. Part (a) of FIG. 2 is a perspective view showing a positional relationship between the exposure head 106 and the photosensitive drum 102, and part (b) of FIG. 2 is a diagram illustrating an internal structure of the exposure head 106 and a state in which a light flux from the exposure head 106 is condensed on the photosensitive drum 102 by a rod lens array 203. As shown in part (a) of FIG. 2, the exposure head 106 is mounted to the image forming apparatus by a mounting member (not shown) at a position facing the photosensitive drum 102 above the photosensitive drum 102 which rotates in an arrow direction (FIG. 1).

As shown in part (b) of FIG. 2, the exposure head 106 is constituted by a printed board 202, a light emitting device group 400 mounted on the printed board 202, the rod lens array 203, and a housing 204. The rod lens array 203 and the printed board 202 are mounted to the housing 204. As shown in FIG. 2, the rod lens array 203 is disposed between the light emitting device group 400 and the photosensitive drum 102. The rod lens array 203 is provided along a longitudinal direction of the printed board 202, and focuses the beam flux emitted from each of the light emitting device groups 400, on the photosensitive drum 102. In the factory, the exposure head 106 is subjected to an assembling and adjusting operation, so that focus adjustment and light quantity adjustment are carried out. Here, assembling and adjustment are performed so that a distance between the photosensitive drum 102 and the rod lens array 203 and a distance between the rod lens array 203 and the light emitting device group 400 are at predetermined intervals. By this, the light from the light emitting device group 400 is imaged on the photosensitive drum 102. Therefore, during the focus adjustment in the factory, the mounting position of the rod lens array 203 is adjusted so that the distance between the rod lens array 203 and the light emitting device group 400 is a predetermined value. In addition, at the time of adjusting the light quantity in the factory, the lower electrode of the light emitting device 401, which will be described hereinafter, is driven so that the liquid condensed on the photosensitive drum 102 via the rod lens array 203 has a predetermined light quantity by adjusting the voltage applied to the light emitting device 401, which will be described later.

[Structure of Light Emitting Device Group]

Figure 3:
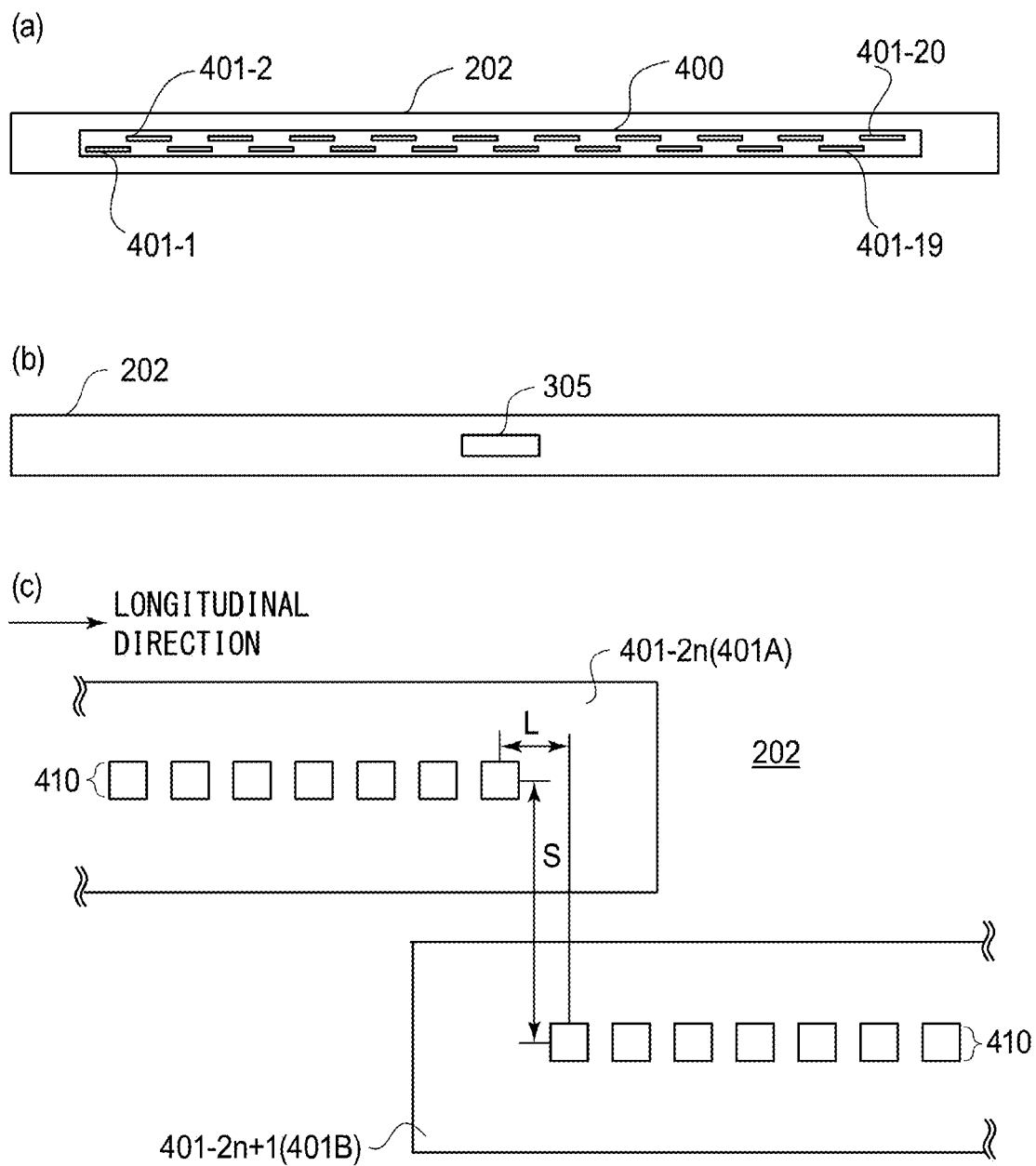
FIG. 3 includes diagrams showing a structure of a printed board.

FIG. 3 includes illustrating the printed board 202 and the light emitting device group 400 mounted on the printed board 202. Part (a) of FIG. 3 is a schematic view showing a structure of a surface of the printed board 202 on which the light emitting device group 400 is mounted, and part (b) of FIG. 3 is a schematic view showing a structure of a surface (second surface) opposite to the surface (first surface) on which the light emitting device group 400 of the printed board 202 is mounted.

As shown in part (a) of FIG. 3, the light emitting device group 400 mounted on the printed board 202, which is a second substrate, has a constitution in which 20 independent light emitting devices 401-1 to 401-20, which are arranged in two rows so as to be staggered along the longitudinal direction of the printed circuit board 202. That is, on the printed board 202 (on the second substrate), odd-numbered light emitting devices 401-1 . . . (401-2$n$+1: $n \geq 0$) and even-numbered light emitting devices 401-2 . . . (401-2$n$: $n \geq 1$) are arranged at different positions in the rotational direction of the photosensitive drum 102. The light emitting devices 401-1 to 401-20 are sometimes collectively referred to as light emitting device 401. Incidentally, in part (a) of FIG. 3, an up-down direction indicates the rotational direction of the photosensitive drum 102 which is a first direction, and a horizontal direction indicates the longitudinal direction which is a second direction perpendicular to the first direction. The longitudinal direction is also a crossing direction that crosses the rotational direction of the photosensitive drum 102. Each light emitting device 401 has therein a total of 748 lower electrodes which will be described hereinafter. In this embodiment, one lower electrode is disposed at each 21.16 µm (≈2.54 cm/1200 dots). As a result, an arrangement distance from the end to the end of the 748 lower electrodes in one light emitting device 401 is about 15.8 mm (≈21.16 µm×748). The light emitting device group 400 is constituted by 20 light emitting device 401. The number of lower electrodes that can be exposed in the light-emitting device group 400 is 14,960 (=748 electrodes×20 chips), and the light-emitting device group 400 is capable of illuminating an area corresponding to an image width, with respect to the longitudinal direction, of about 316 mm (≈about 15.8 mm×20 chips).

Further, as shown in part (b) of FIG. 3, a connector 305 is mounted on the surface of the printed board 202 opposite from the surface on which the light emitting device group 400 is mounted. The connector 305 is a connector for connecting a control signal and a power (source) line for controlling the light emitting device group 400 from an image controller portion 700 (see FIGS. 7A and 7B) which will be described hereinafter, and each of the light emitting devices 401-1 to 401-20 is driven by way of the connector 305.

Part (c) of FIG. 3 is a diagram showing a state of a boundary portion between chips of the light emitting device 401 arranged in two rows in the longitudinal direction, and the horizontal direction is the longitudinal direction of the light emitting device group 400 of part (a) of FIG. 3, along which the plurality of light emitting devices 401 are arranged. Part (c) of FIG. 3 shows the boundary between the chips of the light emitting device 401 (the portion where end portions of the chips overlap with each other in the longitudinal direction (overlap portion)). Also at the boundary between the light emitting device 401-$n$ and the light emitting device 401-$n$+1, a pitch (an interval between the center points of the two adjacent lower electrodes (L)) of the lower electrodes at the end portions between the different light emitting devices 401 is about 21.16 µm, which is the pitch for the resolution of 1200 dpi.

Further, the light emitting devices 401 arranged in the upper and lower two rows in the lateral direction are arranged as follows. That is, the upper and lower light emitting devices 401 are arranged such that an interval between the upper and lower electrodes (indicated by an arrow S in the figure) which will be described hereinafter is about 105 µm (a distance which is an integral multiple of each resolution corresponding to 5 pixels at 1200 dpi, 10 pixels of 2400 dpi). Further, an interval between light emitting points in the longitudinal direction of the exposure head 106 (indicated by an arrow L in the figure) is about 21.16 µm (corresponding to one pixel at 1200 dpi). Incidentally, in the present invention, there is no need that the intervals S and L between the light emitting devices 401 are limited to the values described above.

[Structure of Light Emitting Device]

Figure 4:
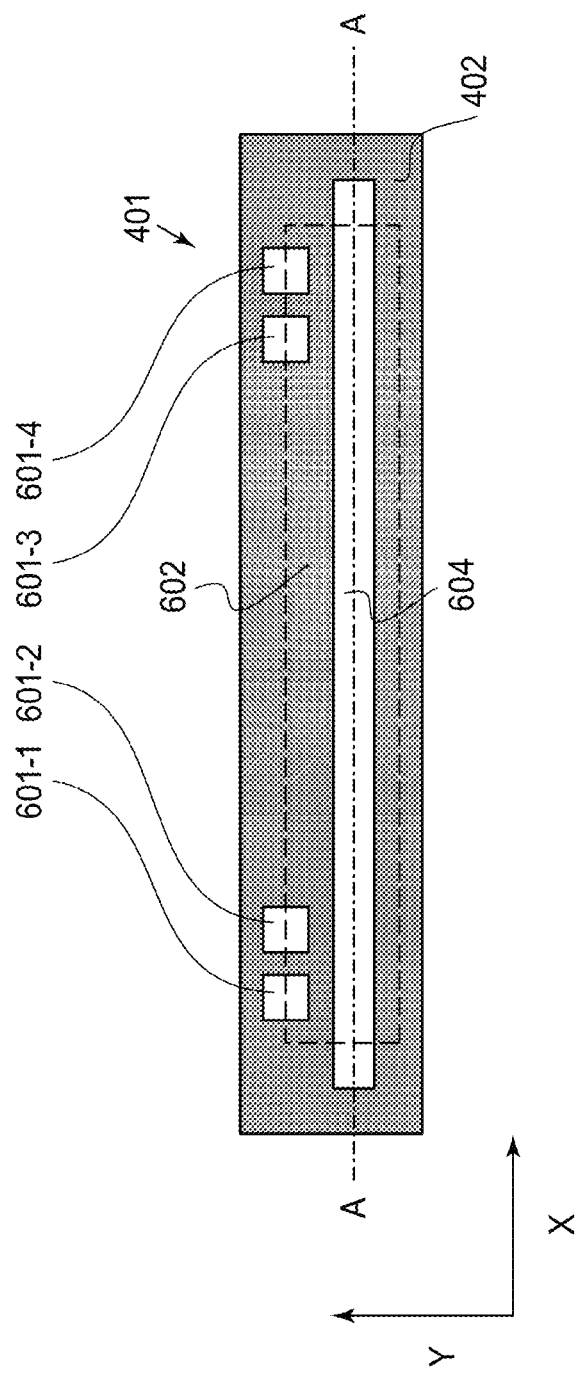
FIG. 4 is a diagram showing a structure of a silicon substrate.

FIG. 4 is a schematic diagram showing an internal structure of the light emitting device 401. Here, as shown in FIG. 4, the longitudinal direction of the light emitting device 401 is an X direction and the short (lateral) direction is a Y direction. Here, the Y direction is the rotational direction of the photosensitive drum 102, and in other words, a moving direction of a photosensitive surface (photosensitive member surface) of the rotatable photosensitive drum 102. The X direction is a direction substantially perpendicular to the Y direction, i.e., the rotational direction of the photosensitive drum 102. It is also a direction substantially parallel to the rotation (axis) direction of the photosensitive drum 102. Incidentally, "substantially perpendicular" allows an inclination of about ±1° relative to an angle of 90°, and "substantially parallel" allows an inclination of about ±1° with respect to an angle of 0°. The light emitting device 401 includes wire bonding pads (hereinafter referred to as WB pads) 601-1, 601-2, 601-3 and 601-4 formed on a silicon substrate 402 which is a first substrate. Incidentally, a circuit portion 602 (broken line), which is a drive section, is built in the silicon substrate 402. As the circuit portion 602, a structure including an analog drive circuit or a digital control circuit or including both the circuits can be used. The power supply to the circuit portion 602 and input/output of signals from outside the light emitting device 401 are performed by way of the WB pads 601.

The light emitting device 401 of this embodiment includes a line-shaped light emitting region 604 extending along the rotation axis direction of the photosensitive drum 102. The light emitting region 604 is a region which includes anodes, cathodes, and light emitting layers 450 (FIG. 5) which will be described hereinafter, and emits light by generation of potential differences between the anodes and the cathodes.

As the silicon substrate 402, a silicon wafer is used. This is because of the following advantages. That is, for the silicon substrates, the process technology for forming integrated circuits has been developed and is already used as a substrate for various integrated circuits, and therefore, high-speed and highly functional circuits can be advantageously produced at high density. Further, with respect to silicon substrates, large-diameter wafers are available on the market, which is advantageous because of inexpensive availability.

In this embodiment, in the circuit portion 602 as a driving portion for driving the light emitting region 604, a data transfer/light-emitting-signal-generating-portion for generating data for generating a signal for causing the light emitting region 604 to emit light (hereinafter, referred to as a light emitting signal), and a driving voltage generating circuit for generating a driving voltage applied to the lower electrodes, and the like are provided. Further, the circuit portion 602 is formed as an integrated circuit on the silicon substrate 402. On these silicon substrates 402, the lower electrodes are deposited so as to be electrically connected. By this, it becomes possible to realize speed-up of a light emitting cycle and to reduce the number of wire bonding to the lower electrodes.

[Structure of Light Emitting Area]

Figure 5:
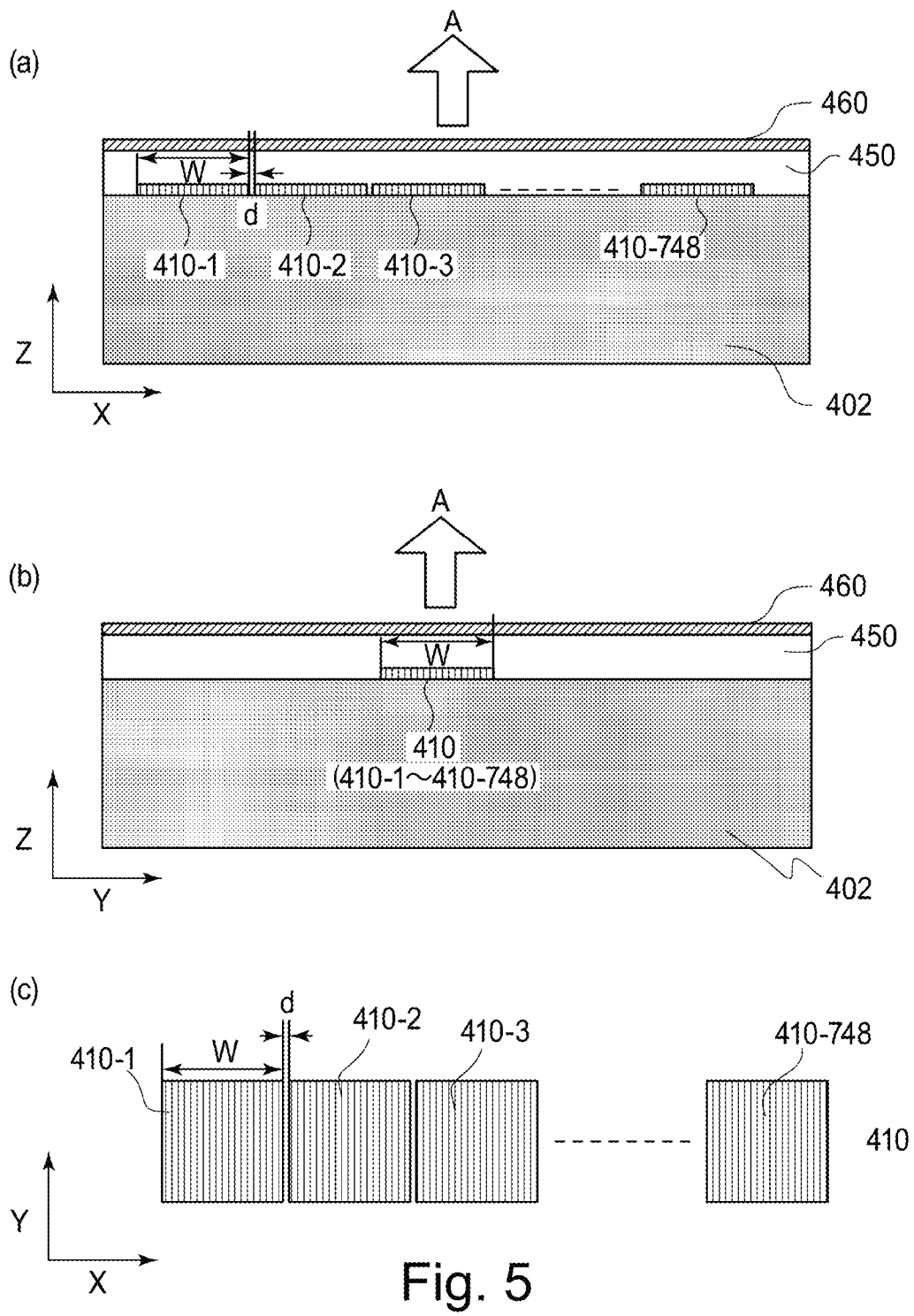
FIG. 5 includes sectional views of a light emitting area, and a structural view showing a light emitting device.

Using FIG. 5, the light emitting device 401 will be described in more detail. The X direction in FIG. 5 indicates the longitudinal direction of the exposure head 106. A Z direction is the direction in which the layers of the layer structure described below overlap (laminating direction). Part (a) of FIG. 5 is an enlarged view of the major parts of the schematic view of a cross-section taken along a line A-A in FIG. 4. Part (a) of FIG. 5 is a schematic view of lower electrodes 410-1 to 410-748, which will be described hereinafter, as viewed in the Y direction. As shown in part (a) of FIG. 5 and part (c) of FIG. 5, the light emitting device 401 includes the silicon substrate 402, the lower electrodes 410-1 to 410-748, the light emitting layer 450, and the upper electrode 460. The silicon substrate 402 is a drive substrate on which drive circuits including driving portions corresponding to the lower electrodes 410-1 to 410-748, respectively, which will be described hereinafter, are formed in the manufacturing process.

As shown in part (a) of FIG. 5 and part (c) of FIG. 5, the lower electrodes 410-1 to 410-748 (cathodes) are formed in layers (first electrode layer) on the silicon substrate 402. The lower electrodes 410-1 to 410-748 are formed on a plurality of driving portions built in the silicon substrate 402 using Si integrated circuit processing technology together with the manufacturing process for manufacturing the silicon substrate 402. The lower electrodes 410-1 to 410-748 are preferably made of a metal including a high reflectance with respect to the emission wavelength of the light emitting layer 450 which will be described hereinafter. Therefore, it is preferable that the lower electrodes 410-1 to 410-748 contain silver (Ag), aluminum (Al), or alloys of them, silver, magnesium alloys, and so on.

As shown in FIG. 5, the lower electrodes 410-1 to 410-748 are electrodes provided corresponding to respective pixels in the X direction. That is, the lower electrodes 410-1 to 410-748 are electrodes each provided to form one pixel. The lower electrodes 410-1 to 410-748 are a first electrode row (array).

A width W of the lower electrodes 410-1 to 410-748 in the X direction in this embodiment is a width which corresponds to a width of one pixel. An interval d is a distance between the lower electrodes (arrangement interval) in the X direction. The lower electrodes 410-1 to 410-748 are formed on the silicon substrate 402 with the interval d, and therefore, the plurality of driving portions formed on the silicon substrate 402 can individually control the voltages of the lower electrodes 410-1 to 410-748. The interval d is filled with an organic material of the light emitting layer 450, and the lower electrodes are partitioned by the organic material.

In the light emitting device 401 according to this embodiment, the width W of the lower electrodes 410-1 to 410-748 is set at 20.90 μm as a nominal dimension, and the interval d is set at 0.26 μm as a nominal dimension. That is, the light emitting device 401 of this embodiment is provided with one lower electrode 410 for every 21.16 μm in the X direction. 21.16 μm is a size of 1 pixel at 1200 dpi, and therefore, the width of the lower electrode 410 in the X direction of each lower electrode 410 has a size corresponding to one pixel corresponding to the output resolution of the image forming apparatus of this embodiment. Incidentally, the process and rule in the light emitting device 401 of this embodiment are highly accurate, that is, about 0.2 μm, and it is possible to form the width of d with a resolution of 0.26 μm.

Further, as shown in part (b) of FIG. 5, the width of the lower electrodes 410-1 to 410-748 in the Y direction which is the rotational direction of the photosensitive drum 102, is also W. That is, the lower electrodes 410-1 to 410-748 of this embodiment have a square shape of 20.90 μm, and the area of the lower electrode 410 is 436.81 μm². This occupies approx. 97.6% of one pixel area of 447.7456 μm². Organic light emitting materials have less light quantity than an LED. On the contrary, as described above, the lower electrode 410 is formed in a square shape and the distance between the adjacent lower electrodes is made small to form it on the silicon substrate 402, so that it becomes possible to assure a light emitting area for obtaining a light quantity to the extent such that the potential on the photosensitive drum 102 is capable of being changed. Incidentally, it is desirable to secure a lower electrode area of 90% or more of the occupied area of one pixel. Accordingly, for an image forming apparatus with an output resolution of 1200 dpi, it is desirable that the width of one side of the lower electrode 410 is formed to be about 20.07 µm or more, and for an image forming apparatus with an output resolution of 2400 dpi, it is desirable that one side of the lower electrode 410 is formed with a width of about 10.04 µm or more.

On the other hand, an upper limit of the occupied area of the lower electrode 410 should be set based on the transmittance of the rod lens array 203 and the upper electrode 460 which will be described hereinafter, but in this embodiment, 110% is set as the upper limit with respect to the occupied area of one pixel. If it is designed so as to be larger than 110% of the area occupied by one pixel, there is a possibility that the size of the pixel formed when exposing the photosensitive drum 102 with high sensitivity significantly exceeds the resolution, and therefore, the upper limit of the occupied area of the lower electrode 410 is set at 110%. Accordingly, for an image forming apparatus having an output resolution of 1200 dpi, it is desirable that one side of the lower electrode 410 is formed to have a width of about 22.19 µm or less, and for an image forming apparatus having an output resolution of 2400 dpi, it is desirable that the width of one side of the lower electrode 410 is about 11.10 µm or less. That is, it is preferable that the range of the occupied area of the lower electrode 410 to the occupied area of one pixel is 90% or more and 110% or less.

Incidentally, the shape of the lower electrode 410 is not limited to a square, and it may also be a polygonal shape higher than quadrilateral, circuit shape, elliptical shape, or the like may be used, if it emits light of an exposure area size corresponding to the output resolution of the image forming apparatus, and if by the light the image quality of the output image is of a level which satisfies the design specifications of the image forming apparatus.

Next, the light emitting layer 450 will be described. The light emitting layer 450 is formed by being laminated on the silicon substrate 402 on which the lower electrodes 410-1 to 410-748 are formed. That is, in the portions where the lower electrodes 410-1 to 410-748 are formed, the light emitting layer 450 is laminated on the lower electrodes 410-1 to 410-748. In a portion where they are not formed, the lower electrodes 410-1 to 410-748 are laminated on the silicon substrate 402. In this embodiment, in the light emitting device 401, the light emitting layer 450 is formed so as to extend over all of the lower electrodes 410-1 to 410-748, but this embodiment is not limited thereto. For example, similarly to the lower electrodes 410-1 to 410-748, the light emitting layer 450 may be formed so as to be separately laminated on each lower electrode, or the lower electrodes 410-1 to 410-748 may be divided into a plurality of groups, and then, for each of the divided groups, one light emitting layer may be laminated on the lower electrode belonging to the group.

For the light emitting layer 450, an organic material, for example may be used. The light emitting layer 450, which is an organic EL film, has a laminated structure including functional layers such as an electron transport layer, a hole transport layer, an electron injection layer, a hole injection layer, an electron block layer, and a hole block layer. For the light emitting layer 450, an inorganic material, having a light emitting characteristic, other than an organic material may be used.

The upper electrode 460 (anode) is laminated on the light emitting layer 450 (second electrode layer). The lower electrodes 410, the light emitting layer 450, and the upper electrode 460 form a laminar member. The upper electrode 460 is an electrode capable of transmitting light having an emission wavelength of the light emitting layer 450 (transmittable electrode). For that reason, the upper electrode 460 of this embodiment employs a material containing indium tin oxide (ITO) as a transparent electrode. The indium tin oxide electrode has a transmittance of 80% or more for the light in the visible light range, and therefore, it is suitable as an electrode for organic EL.

The upper electrode 460 is formed on the opposite side of the lower electrodes 410-1 to 410-748 with at least the light emitting layer 450 interposed therebetween. That is, the light emitting layer 450 is arranged between the upper electrode 460 and the lower electrodes 410-1 to 410-748 in the Z direction, and when the lower electrodes 410-1 to 410-748 are projected on the upper electrode 460 in the Z direction, the area where the lower electrodes 410-1 to 410-748 are formed falls within a region where the upper electrode 460 is formed. Incidentally, the transparent electrode does not have to be laminated over the entire light emitting layer 450, but in order to efficiently emit the light generated in the light emitting layer 450 to the outside of the light emitting device 401, it is preferable that the area occupied by the upper electrode 460 is 100% or more with respect to the area occupied by one pixel, and more preferably it is 120% or more. The upper limit of the area occupied by the upper electrode 460 is arbitrarily designed depending on the area of the silicon substrate 402 and the light emitting layer 450. Wiring may be provided in the upper electrode 460 except for the portion which transmits light.

The upper electrode 460 of this embodiment is an anode commonly provided for each of the lower electrodes 410-1 to 410-748, but the lower electrodes 410-1 to 410-748 may be individually provided, or one upper electrode may be provided for each of a plurality of lower electrodes.

The drive circuit controls the electric potential of the lower electrodes 410-1 to 410-748 in order to generate a potential difference between the upper electrode 460 and any one of the lower electrodes 410-1 to 410-748 on the basis of the image data.

The light emitting device 401 in this embodiment is a device of an emission type which is a so-called top emission type. When voltages are applied to the upper electrode 460 which is the anode, and to the lower electrode 410 which is the cathode, and a potential difference is generated between them, electrons flow from the cathode of the light emitting layer 450, and holes flow from the anode to the light emitting layer 450. And, the light emitting layer 450 emits the light by recombination of electrons and holes in the light emitting layer 450. The light emitted toward the upper electrode 460 by light emission of the light emitting layer 450 passes through the upper electrode 460 and is emitted from the light emitting device 401 in the direction of arrow A shown in FIG. 5. Further, the light travelling from the light emitting layer 450 toward the lower electrode 410 is reflected by the lower electrode 410 toward the upper electrode 460, and the reflected light also passes through the upper electrode 460 and is emitted from the light emitting device 401. There arises a time difference between the light emitted from the light emitting layer 450 directly toward the upper electrode 460 and the light reflected by each lower electrode 410 and emitted from the upper electrode 460, in emitting timing from the upper electrode 460, but, the layer thickness of the light emitting device 401 is extremely small, and therefore, the emission timings can be regarded as almost the same.

Incidentally, the light emitting device of this embodiment may also be of an emission type which is a bottom emission type.

By using the transparent electrode such as indium tin oxide as the upper electrode 460, an aperture ratio indicating the light transmission ratio of the electrode can be made substantially equal to the transmittance of the upper electrode 460. That is, there is virtually no portion that attenuates or blocks light except the upper electrode 460, and therefore, the light emitted from the light emitting layer 450 becomes emitted light without being attenuated to the extent possible or blocked.

Further, as described above, the lower electrodes 410-1 to 410-748 can be arranged at a high density by forming the lower electrodes 410-1 to 410-748 using a highly accurate Si integrated circuit processing technique. Therefore, almost all of the area of the light emitting region 604 (here, the total of the areas of the lower electrodes 410-1 to 410-748 and the area between the adjacent lower electrodes) can be assigned to the lower electrodes 410-1 to 410-748. That is, the exposure head has a high utilization efficiency of the light emitting region per unit area.

Incidentally, in the case that a light-emitting material such as an organic EL layer or an inorganic EL layer that is weak against moisture is used as the light-emitting layer 450, it is desirably that a sealing is provided in order to prevent moisture from entering the light emitting region 604. As a sealing method, for example, a single or laminated thin film of silicon oxide, silicon nitride, aluminum oxide, or the like is formed. As a method for forming the sealing film, a method excellent in coating performance for the structures such as steps is preferred, and an atomic layer deposition method (ALD method) or the like, for example can be used. Incidentally, the material, structure, forming method of the sealing film are examples, and the present invention is not limited to the above examples, and a suitable one may be appropriately selected.

[Control Block]

Figure 6:
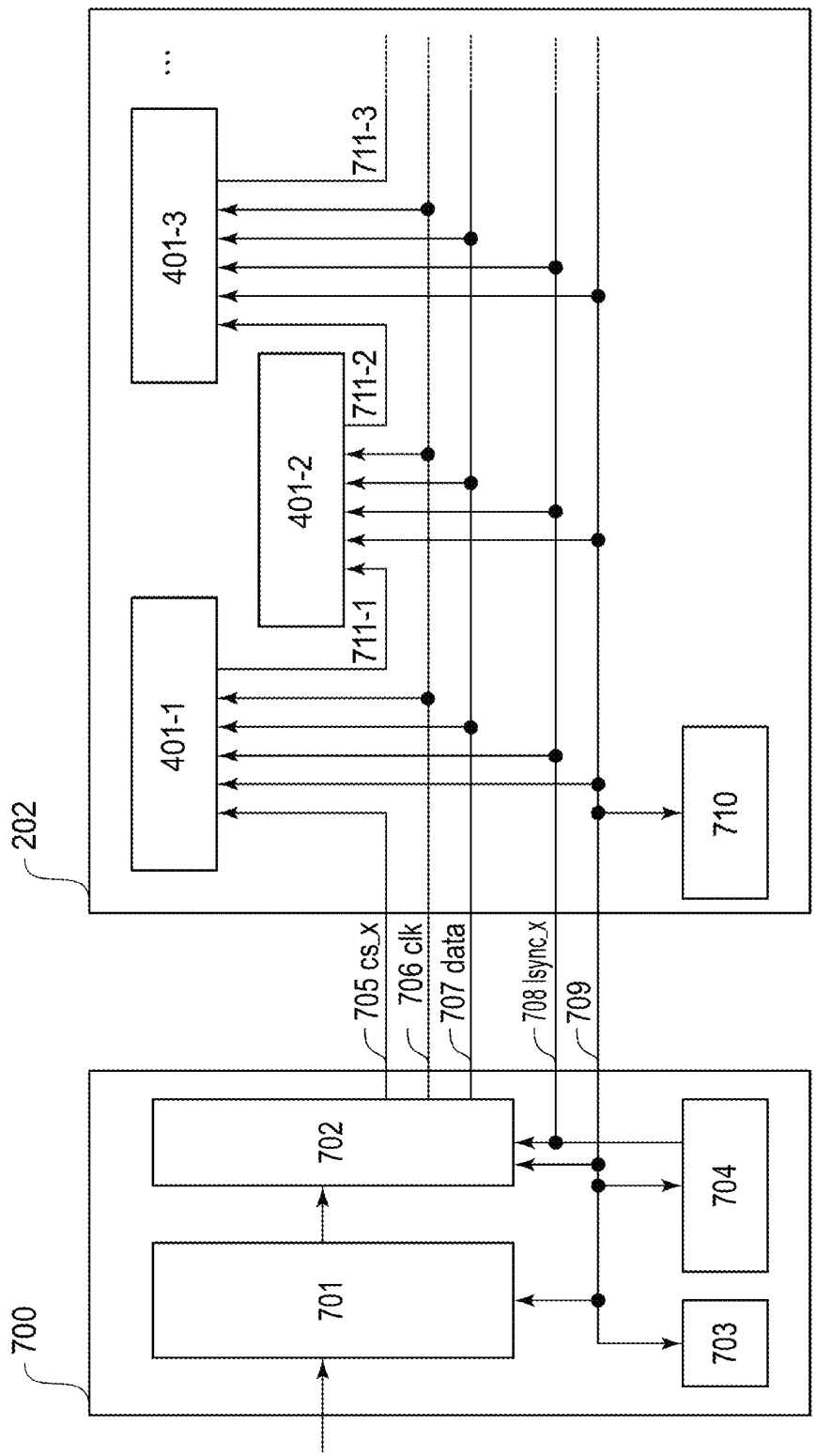
FIG. 6 is a block diagram of an image controller portion and the printed board.

FIG. 6 shows a block diagram of the image controller portion 700 and the printed board 202. In the following, a chip select signal is ex_x, a line synchronization signal is lsync_x, a block signal is clk, and an image data signal is data. In the embodiment 1, processing of a single color will be described for simplification of an explanation, but, similar processing is performed in parallel for the four colors.

(Image Controller Portion)

The image data generated by the scanner portion 100 is inputted to the image controller portion 700 as a processor which is at least one IC, and the image controller portion 700 sends a control signal for controlling the printed board 202, to the printed board 202 via a cable such as a flexible flat cable. Incidentally, the image data inputted to the image controller portion 700 may be data generated by the scanner portion 100 as described above, or may be data transferred from a personal computer by way of a network device (not shown). The control signals include the chip select signal cs_x indicating the effective range of the image data, the clock signal clk, the image data signal data, the line synchronization signal lsync_x indicating the division of the image data for each line, and a communication signal with the CPU 703. Each signal is transmitted to the light emitting device 401 in the printed board 202 by way of the chip select signal line 705, the clock signal line 706, the image data signal line 707, the line synchronization signal line 708, and the communication signal line 709. The image controller portion 700 performs processing for image data and processing for print timing. The image data generating portion 701 performs dithering processing on the image data received from the scanner portion 100 or the outside of the image forming apparatus as the resolution designated by the CPU 703 to generate image data for print output. In the embodiment 1, for example, the dithering process is performed at the resolution of 1200 dpi.

The synchronization signal generating portion 704 generates the line synchronization signal lsync_x which is a second signal. The CPU 703 instructs the synchronization signal generating portion 704 about the time interval of the signal cycle as one line cycle for a predetermined rotation speed of the photosensitive drum 102. Here, the one line cycle is a cycle in which the surface of the photosensitive drum 102 moves in the rotational direction by a pixel size (about 21.16 µm) at 1200 dpi. For example, in the case where printing is performed at a speed of 200 mm/s in the recording sheet feeding direction, the CPU 703 instructs the time interval, to the synchronization signal generating portion 704, with one line cycle as being 105.8 µs (two decimal places or less omitted). The speed in the feed direction is calculated by the CPU 703 using a set value (fixed value) of the printing speed (image forming speed) set in the control portion (not shown) which controls the speed of the photosensitive drum 102. Incidentally, the printing speed is set depending on the kind of recording sheet, for example.

The chip data converting portion 702 divides the image data for one line into those for each light emitting device 401 in synchronization with the line synchronization signal lsync_x generated by the synchronization signal generating portion 704. The chip data converting portion 702 transmits the image data divided for each light emitting device 401 to the printed board 202 together with the clock signal clk and the chip select signal cs_x. The clock signal clk is signal which serves as a control reference.

(Printed Board)

Next, a structure of the printed board 202 will be described. The head information storage portion 710 is a storage device which stores head information such as the amount of light emitted from each light emitting device 401 and mounting position information, and is connected to the CPU 703 by way of the communication signal line 709. The clock signal line 706, the image data signal line 707, the line synchronization signal line 708, and the communication signal line 709 which are extended from the image controller 700 are branched and are connected to each of the light emitting devices 401. The chip select signal line 705 extended from the image controller 700 and for transmitting the chip select signal is connected to the light emitting device 401-1. Further, an output of the light emitting device 401-1 is connected to an input of the light emitting device 401-2 via a signal line 711-1, and an output of the light emitting device 401-2 is connected to an input of the light emitting device 401-3 via a signal line 711-2. Thus, the chip select signal line 705 (or the signal line 711) is connected via each of the light emitting devices 401 in a so-called manner which that they are tied one to the next (cascade connection). Each lower electrode 401 controls the voltage of the lower electrode of each light emitting device 401 on the basis of the set values set by the chip select signal line 705, the clock signal line 706, the line synchronization signal line 708, the image data signal line 707, or the communication signal line 709. Further, each light emitting device 401-*n* generates the chip select signal for a subsequent (post-stage) light emitting device 401-*n*+1.

[Circuit Structure in Light Emitting Device]

Figure 7A:
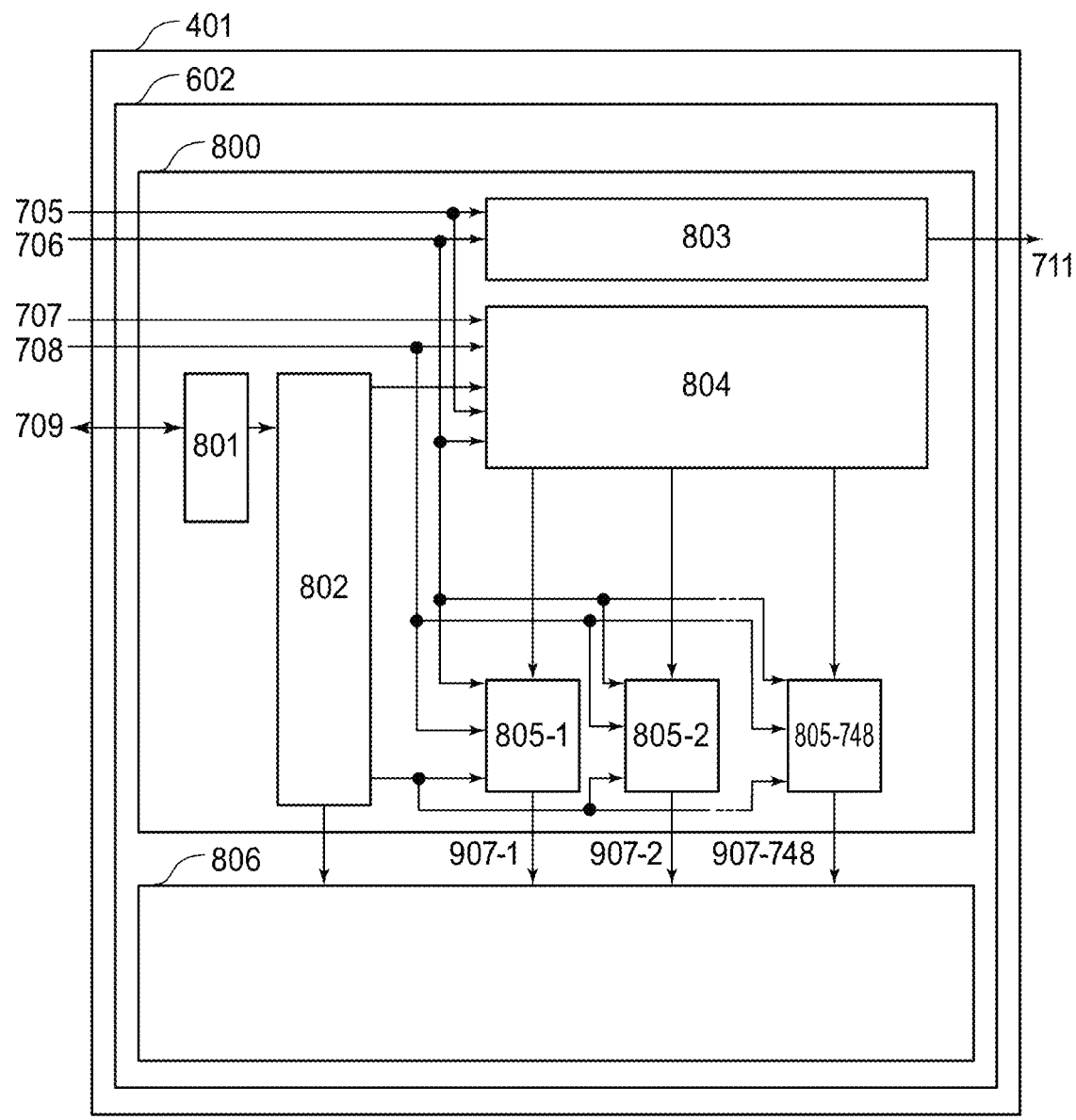
FIG. 7A is a circuit block diagram in the light emitting device.

FIG. 7A is a circuit block diagram in the light emitting device 401. The circuit portion 602 in the light emitting device 401 has a digital portion 800 and an analog portion 806. The digital portion 800 has a function of generating a pulse signal for driving the lower electrode 410-*n* based on the set value preset by the communication signal and various signals in synchronization with the clock signal clk, and sending, the generated pulse signal through the pulse signal line 907, to the analog portion 806. Here, the various signals refer to the chip select signal cs_x, the image data signal data, and the like synchronization signal lsync_x. Further, the digital portion 800 has a function of generating a chip select signal for a subsequent light emitting device 401 from the inputted chip select signal cs_x.

[Digital Part]

The communication IF portion 801 controls writing and reading of the set value for the register portion 802 on the basis of a communication signal from the CPU 703. The register portion 802 stores the value necessary for the operation (set value preset in advance). This set value includes exposure timing information usable with the image data storage portion 804, width and phase information of the pulse signal generated by the pulse signal generating portion 805, and set information of the drive voltage set by the analog portion 806, and the like. Incidentally, the drive voltage can be derived from a resistance value between the lower electrode and the upper electrode, and a range of this resistance value is determined in advance, and therefore, information about the drive current may be stored instead of the drive voltage setting information. The register portion 802 stores at least one of these pieces of information. The chip select signal generating portion 803 which is a first generating portion delays the inputted chip select signal cs_x which is a first signal, and generates the chip select signal for the subsequent light emitting device 401, and sends the generated chip select signal via the signal line 711. The chip select signal is an enabling signal for enabling the light emitting device 401 to sample the image data. The image data storage portion 804 receives, via the data signal line 707, and holds the image data outputted by the image controller 700 during the period in which the inputted chip select signal cs_x is valid, and outputs the image data to the pulse signal generating portion 805 in synchronization with the line synchronization signal lsync_x. Details will be described hereinafter.

The pulse signal generating portion 805 generates a pulse signal on the basis of pulse signal width information and phase information set in the register portion 802 depending on the image data inputted from the image data storage portion 804, and outputs it to the analog portion 806. Details will be described hereinafter. The analog portion 806 generates a signal required to drive the lower electrode on the basis of the pulse signal generated by the digital portion 800. Details will be described hereinafter.

(Image Data Storage Portion)

Figure 7B:
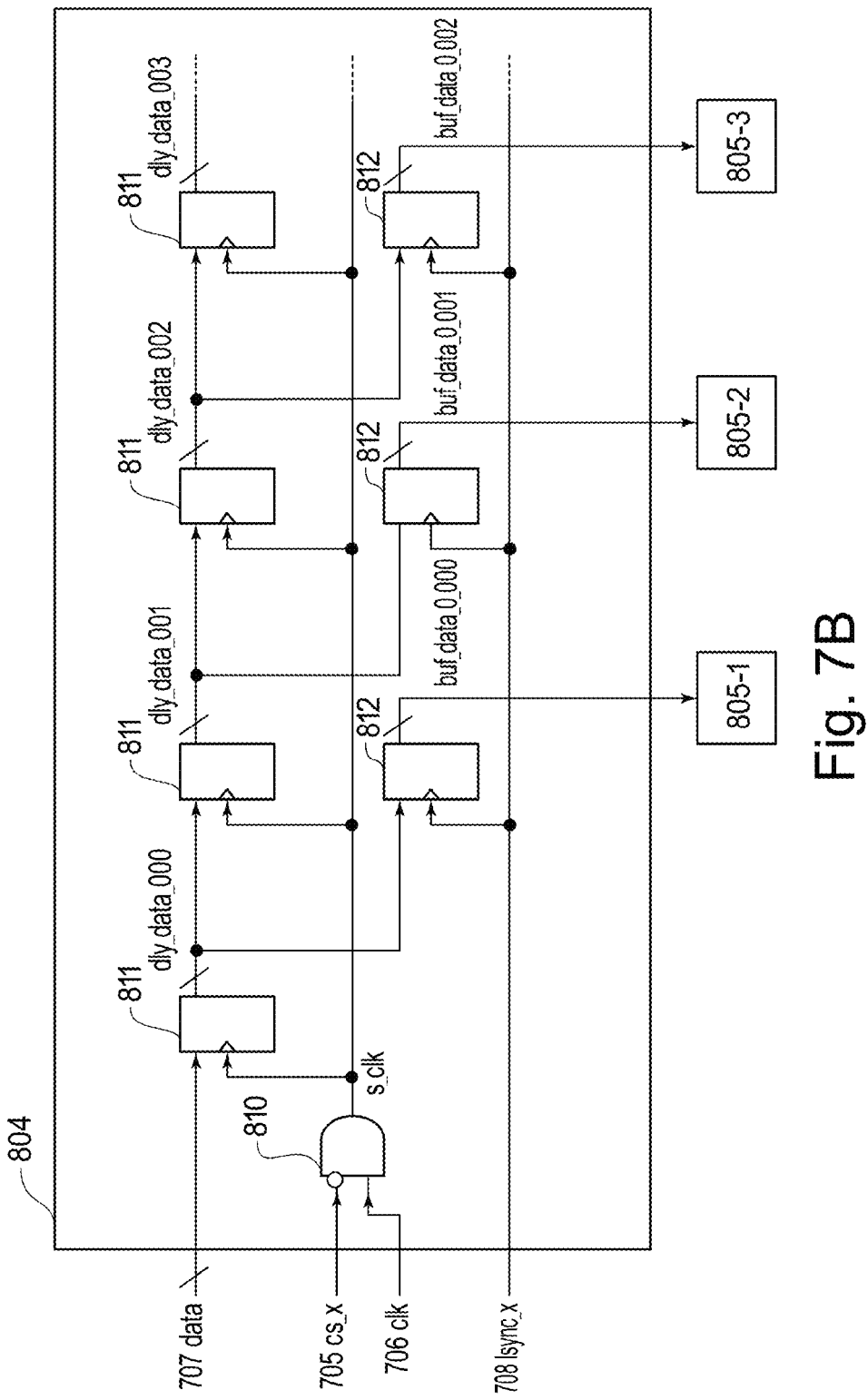
FIG. 7B is a circuit structure diagram of an image data storing portion.

Next, the operation of the image data storage portion 804 will be described. The image data storage portion 804 of the embodiment 1 is built in the light emitting device 401. An example in which the chip select signal cs_x and line synchronization signal lsync_x are negative logic signals will be described, but these signals may also be positive logic signals. FIG. 7B is a circuit structure diagram of the image data storage portion 804. The clock gate circuit 810 outputs the logical product of an inverted signal of the chip select signal cs_x and the clock signal clk. The clock gate circuit 810 outputs the clock signal s_clk to a flip-flop circuit 811 only when the chip select signal cs_x is valid.

The flip-flop circuit 811 receives the image data signal data inputted to the image data storage portion 804, as an original input. The same number of flip-flop circuits 811 as the lower electrodes 410 provided in the longitudinal direction of the light emitting device 401 (748 in the embodiment 1) are connected in series and constitutes a shift register. The flip-flop circuit 811 operates in accordance with the clock signal s_clk fed from the clock gate circuit 810. Specifically, image data outputted by the image controller 700 depending on the clock signal s_clk is sampled by a highest-class flip-flop circuit 811 of the shift register, and each flip-flop circuit 811 subjects the sampled image data to shift processing to a post-stage flip-flop circuit. The flip-flop circuit 811 and 812 are provided correspondingly to the number of the lower electrodes 410 (748 in this embodiment) in the longitudinal direction of the lower electrodes 410.

The flip-flop circuit 812 as a register receives the output of the flip-flop circuit 811 as an input, and operates depending on the line synchronization signal lsync_x. The output of the flip-flop circuit 812 is outputted to the pulse signal generating portions 805 as the image data buf_data_0_000 to buf_data_0_747.

Figure 8:
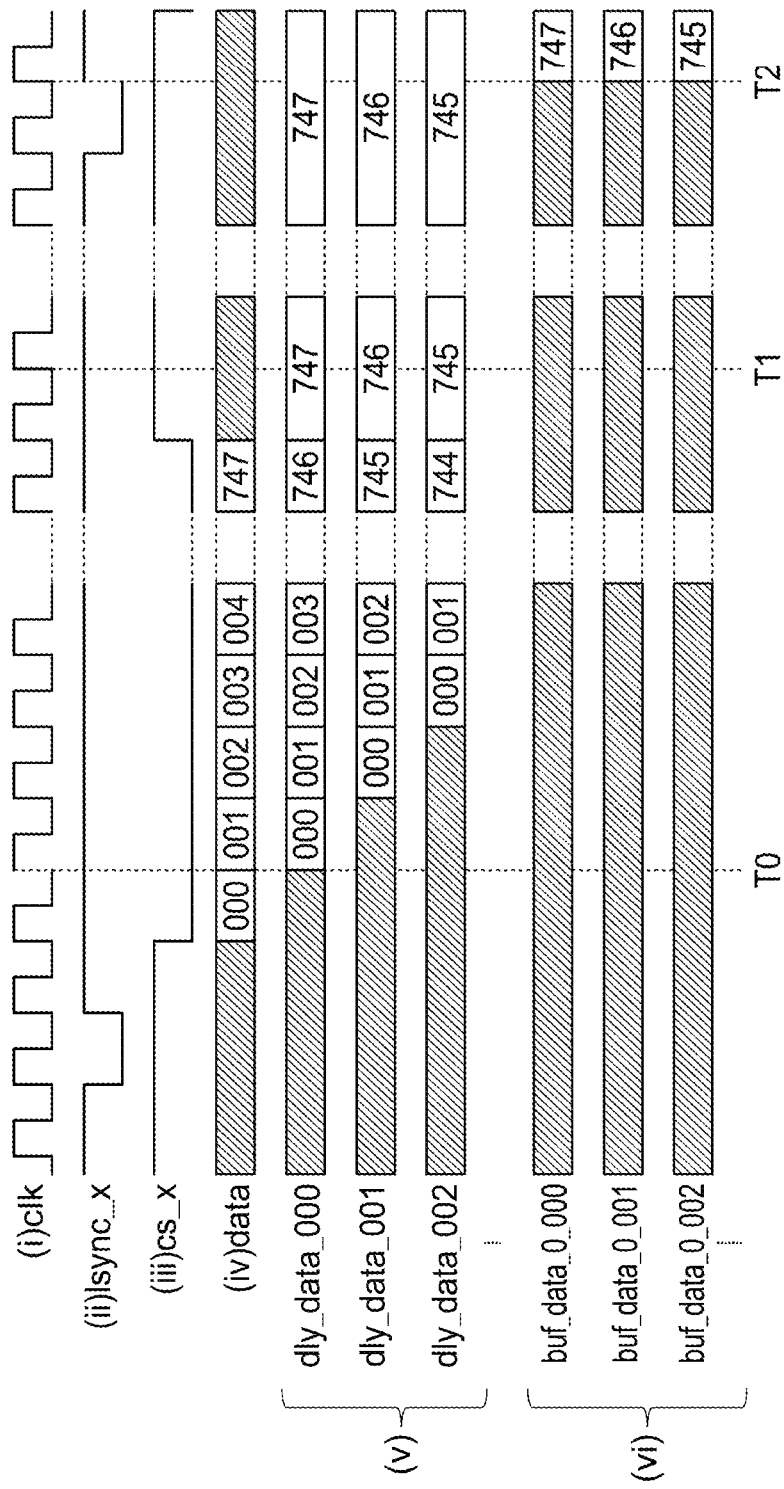
FIG. 8 is a diagram showing waveforms of respective signals and shift of image data.

FIG. 8 is a timing chart showing the operation in the longitudinal direction of the light emitting device 401 of the image data storage portion 804. FIG. 8 shows the waveform of the clock signal clk in (i), the waveform of the line synchronization signal lsync_x in (ii), the waveform of the chip select signal cs_x in (iii), and (iv) indicates the image data signal data by 000 to 747. Here, value "000" indicates image data corresponding to the lower electrode 410-1, and "747" indicates image data corresponding to the lower electrode 410-748. The shaded (hatched) portion of the image data signal data indicates invalid data as image data. Part (v) shows the image data dly_data_000 and so on which are the output of the flip-flop circuit 811 and (vi) shows the image data bufdata_0_000 and so on which is the output of the flip-flop circuit 812.

During the period from time T0 to time T1 in which the chip select signal cs_x is 0 (cs_x=0 (low level)), the image data is shifted as follows by way of the flip-flop circuits 811 connected in series. The time T1 is the time when cs_x=0 is captured at the rising edge of the clock signal clk. That is, the shifting occurs in the order of data→dly_data_000→dly_data_001→ . . . →dly_data_747 and so on. In a period in which the chip select signal cs_x is at a low level (cs_x=0), it is assumed that the same number of clock signals clk as the number of lower electrodes 410 in the longitudinal direction of the light emitting device 401, that is, 748 signals are inputted. By doing so, image data corresponding to one line is held in dly_data_000 to dly_data_747.

Since the chip select signal cs_x is 1 (cs_x=1 (high level)) after the time T1, the shift operation is not performed and the image data at the time T1 is held. For example, the image data dly_data_000 held in the first flip-flop circuit 811 after time T1 is 747. When the line synchronization signal lsync_x becomes 0 (lsync_x=0 (low level)) at time T2, the image data for one line is simultaneously outputted to the pulse signal generating portion 805 as buf_data_0_000 to buf_data_0_747. The time T2 is the time when lsync_x=0 is captured at the rising edge of the clock signal clk. That is, the image data dly_data_000 and the like held in the flip-flop circuit 811 is outputted to the pulse signal generating portion 805 as image data buf_data_0_000 and the like by way of the flip-flop circuit 812.

(Pulse Signal Generating Portion)

The pulse signal generating portion 805 will be described. When the number of the lower electrodes 410 is n, the same number (n) of the pulse signal generating portions 805 as the number of the lower electrodes 410 also exist. In the embodiment 1, the pulse signal generating portions 805-1 to 805-748 exist for the lower electrodes 410-1 to 410-748. Incidentally, the structure of the pulse signal generating portion 805 included in each lower electrode 410 is the same. Therefore, here, the pulse signal generating portion 805-1 will be described as an example.

Figure 9:
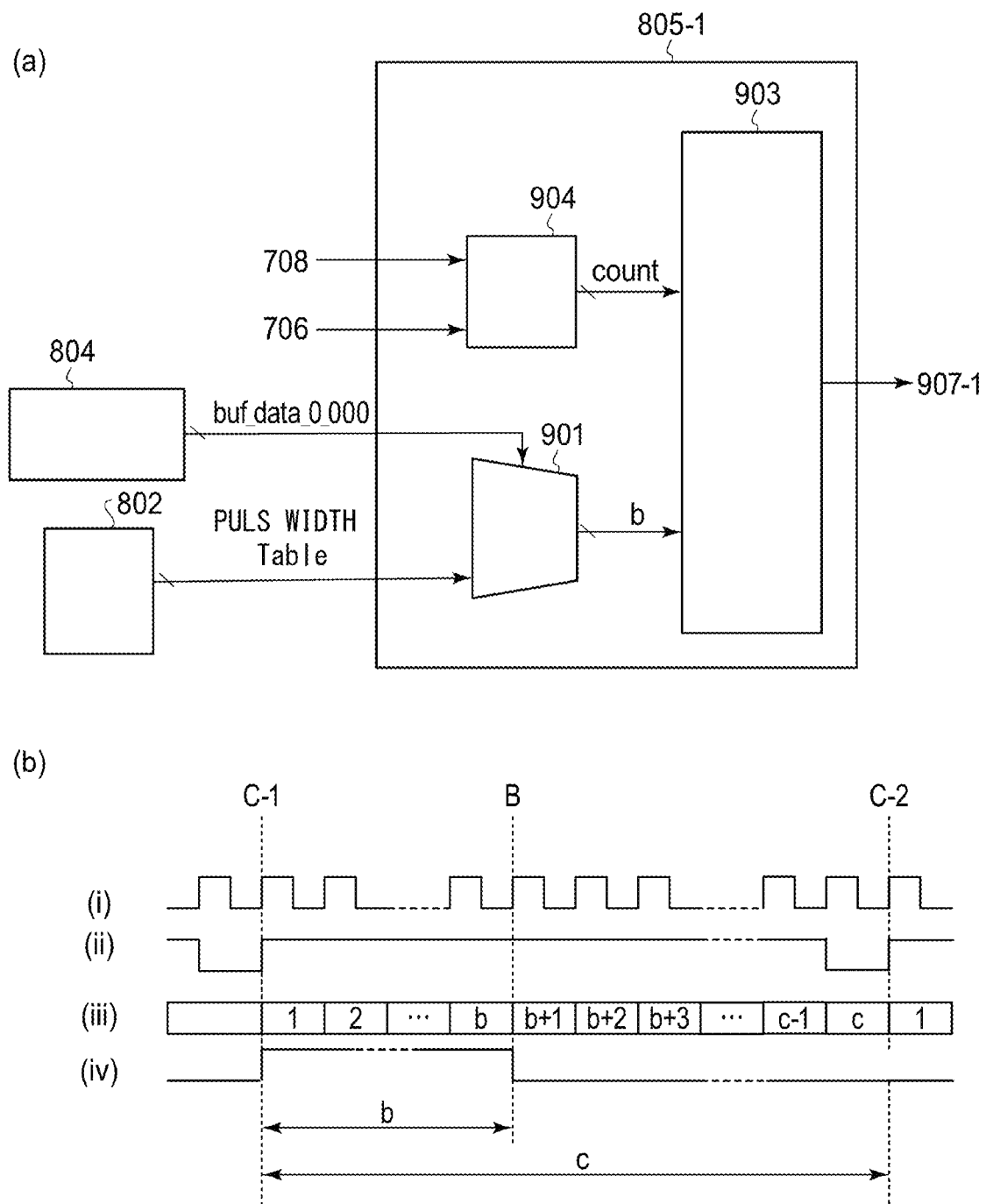
FIG. 9 includes an illustration of a pulse signal generating portion and a waveform of each signal.

Part (a) of FIG. 9 is a block diagram of the pulse signal generating portion 805-1. The pulse signal generating portion 805-1 includes a pulse width selecting portion 901, an output determining portion 903, and a counter portion 904. The pulse width selecting portion 901 converts the image data inputted from the data storage portion 804 into the pulse width b in accordance with the pulse table for the pulse signal set by the register portion 802. Table 1 shows the pulse width Table, which is a conversion table when converting the image data to pulse width b.

TABLE 1

| Image dada [3:0] | Pulse width b |
|---|---|
| 0 | 0 |
| 1 | 4 |
| 2 | 8 |
| 3 | 12 |
| 4 | 16 |
| 5 | 20 |
| 6 | 24 |
| 7 | 28 |
| 8 | 32 |
| 9 | 36 |
| 10 | 40 |
| 11 | 44 |
| 12 | 48 |
| 13 | 52 |
| 14 | 56 |
| 15 | 60 |

Table 1 shows the image data in a first column and the pulse width b of the pulse signal corresponding to the image data in a second column. For example, the image data is four bits ([3:0]) (0 to 15).

For example, when input of the image data is 2, the pulse width selecting portion 901 (pulse width determining portion) outputs the pulse width b as 8 to the output determining portion 903 based on the pulse width Table of Table 1 set by the register portion 802. However, the pulse width Table shown in Table 1 is an example, and bit widths of the image data and the pulse width may be different from the example of Table 1, and the value of the pulse width b can be set arbitrarily. The pulse width table 1 stored in the register portion 802 may be set individually for each lower electrode 410 or may be common.

The light emitting layer 450 corresponding to the lower electrode 410 may have different light amounts even when the pulse signals have the same pulse width, due to process variations and the like. The variations in the amount of light of the light emitting layers 450 corresponding to the lower electrodes 410-1 to 410-748 result in unevenness in the electrostatic latent image formed on the photosensitive drum 102, that is, result in unevenness in the printed image. In order to eliminate the unevenness of the electrostatic latent image, the pulse width Table is set for each of the lower electrodes 410-1 to 410-748 depending on the measured light quantity, so that the pulse width of the pulse signal outputted so as to form an image with a dot width adapted to the inputted image data is changed. By setting the pulse width Table for each of the lower electrodes 410-1 to 410-748 using the above-described control, it is possible to correct the unevenness of the printed image caused by the variation in the light quantity of each light emitting layer 450 corresponding to the lower electrodes 410-1 to 410-748. Incidentally, measurement of the light quantity of the light emitting layer 450 corresponding to the lower electrodes 410-1 to 410-748 is made in the factory or is performed by installing a light quantity measuring device (not shown) at a position opposing the exposure head 106.

The counter portion 904 counts the clock signal clk inputted from the image controller 700 via the clock signal line 706 and resets the count for each cycle (hereinafter, referred to as line synchronization signal cycle) c of the line synchronization signal lsync_x, to 1 (timing C-1 and timing C-2 in part (b) of FIG. 9). The line synchronization signal period is shown as the timing C-1 and the timing C-2 in part (B) of FIG. 9 which will be described hereinafter. The output of the counter, portion 904 is represented by "count", and the count is inputted to the output determining portion 903. In the embodiment 1, the count is 1 by resetting, but is not required to be 1. Further, in the embodiment 1, a counting method of the clock signal clk is up-counting, but it may also be down-counting. The counter portion 904 may be provided for each pulse signal generating portion 805 corresponding to each lower electrode 410, or it may be common.

The operation of output determining portion 903 will be described using part (b) of FIG. 9. In part (b) of FIG. 9, (i) shows the waveform of the clock signal clk, and (ii) shows the waveform of the line synchronization signal lsync_x. Part (iii) shows the count value outputted from the counter portion 904, and (iv) shows the waveform of the pulse signal generated by the pulse signal generating portion 805.

The output determining portion 903 generates a pulse signal depending on the count inputted from the counter portion 904 and the pulse width b outputted from the pulse width selecting portion 901. The output determining portion 903 sets the pulse signal, which is an output, to high level at the timing (timing C-1 and C-2) when the line synchronization signal lsync_x is at the low level during the rising of the clock signal clk. The output determining portion 903 then sets the pulse signal, which is the output, to the low level at the timing (timing B) at which the count coincides with the pulse width b during the rising of the clock signal clk. By this, the output determining portion 903 generates the pulse signal.

[Modified Example of Digital Portion]

Figure 10:
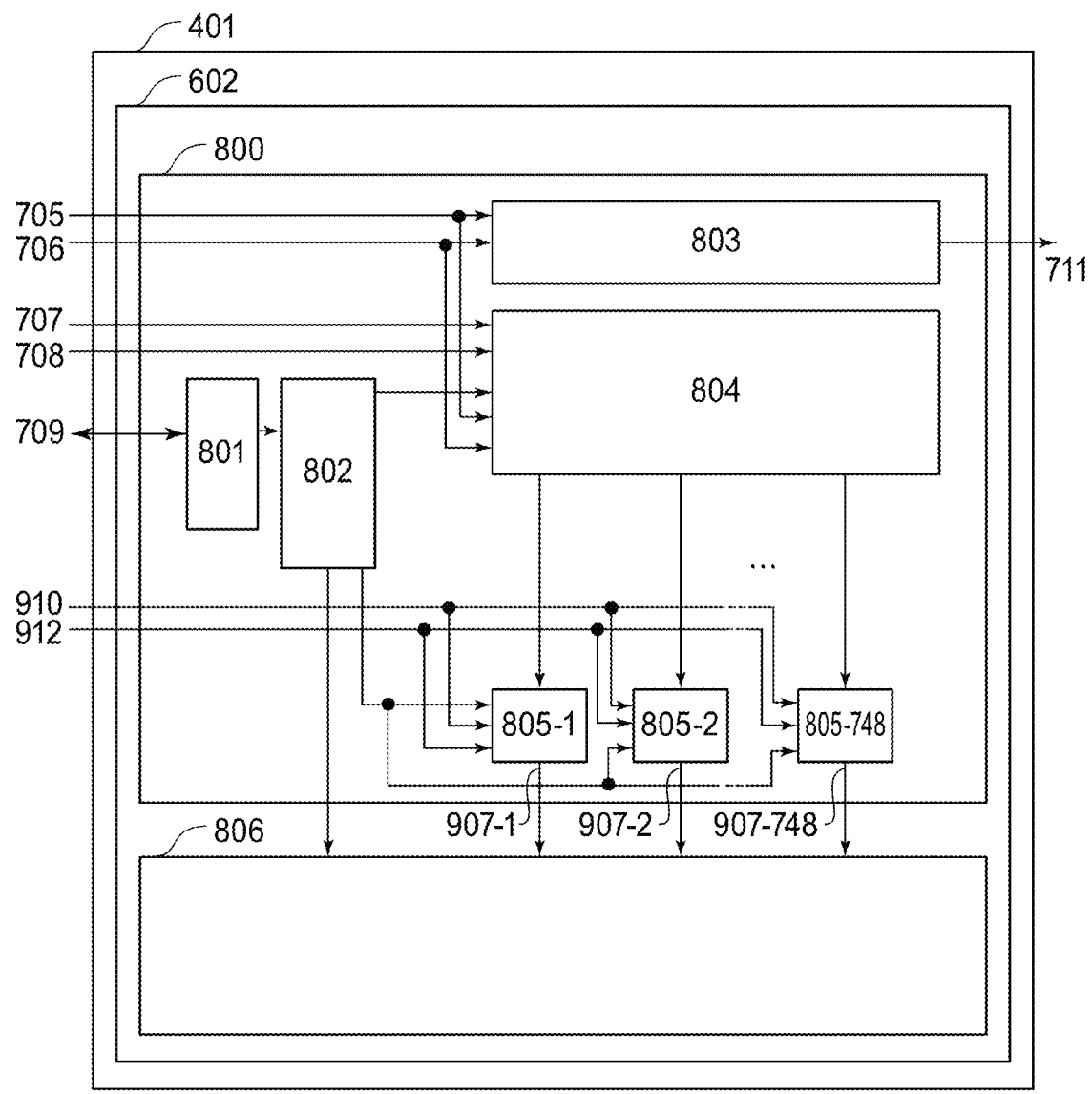
FIG. 10 is a circuit diagram in the light emitting device.

Incidentally, the clock signal clk and the line synchronization signal lsync_x which are used in the pulse signal generating portion 805 may be inputted as follows. For example, these signals are formed individually by the image controller portion 700 and may be inputted to the pulse signal generating portion 805 via the pulse generating clock signal line 910 and the pulse generating line synchronization signal line 912 as shown in FIG. 10. However, as shown in FIG. 7A, by using the clock signal line 706 and the line synchronization signal line 708 for inputting the clock signal clk and the line synchronization signal lsync_s which are used in the pulse signal generating portion 805, it is possible to reduce wiring on the printed board 202.

[Analog Portion]

Figure 11:
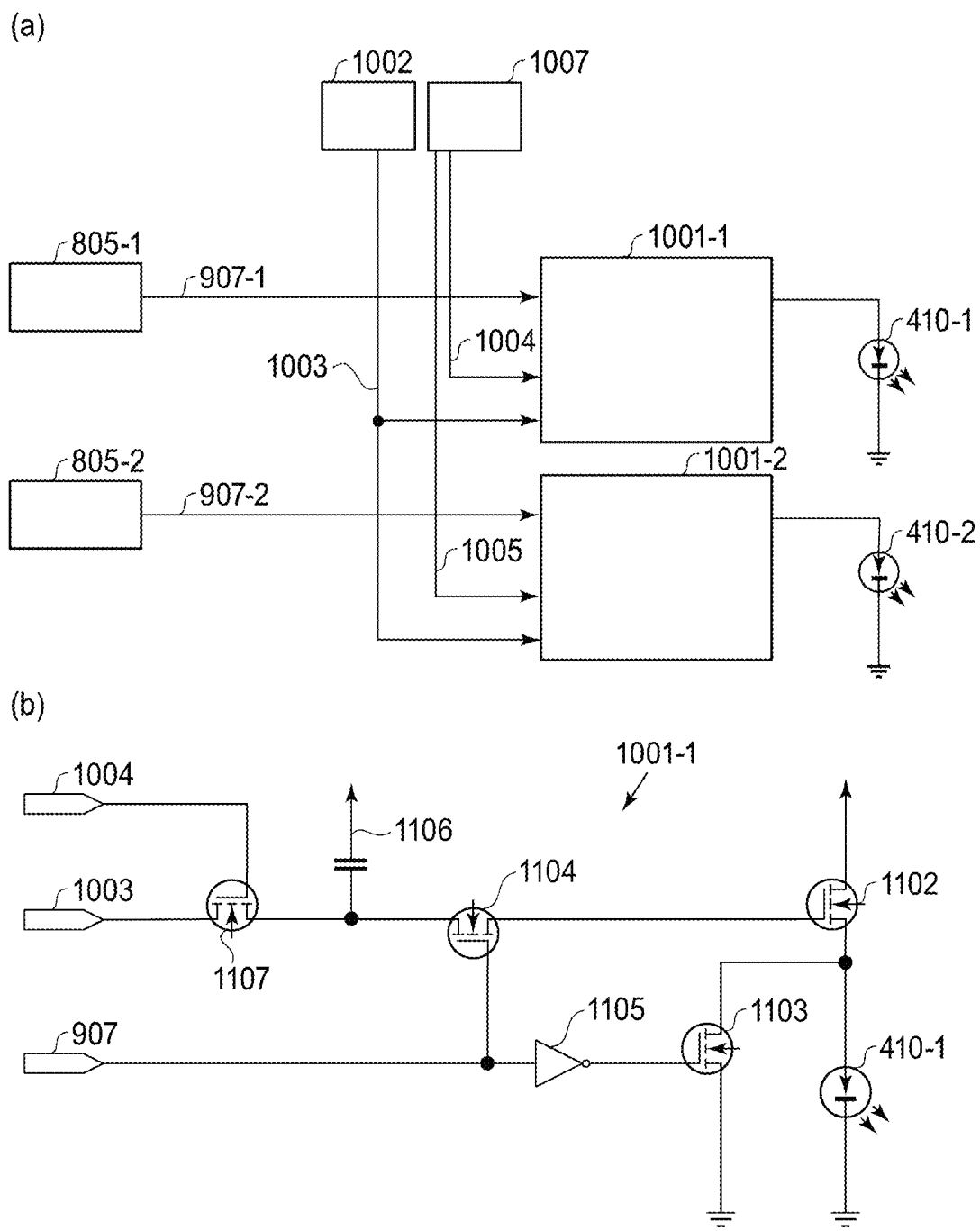
FIG. 11 includes a block diagram of an analog portion and a circuit diagram of a driving portion.

Part (a) of FIG. 11 shows a block diagram of the analog portion 806. In the embodiment 1, for the purpose of simplification of explanation, driving portions 1001-1 and 1001-2 for driving the two lower electrodes 410-1 and 410-2 of the lower electrodes 410-1 to 410-748 will be described through illustration. However, it is assumed that the similar driving portions 1001-3 to 1001-748 are formed corresponding to the lower electrodes 410-3 to 410-748. Further, as described above, it is the light emitting layer 450 in regions corresponding to the lower electrodes 410-1 and 410-2 that actually emit light by driving the lower electrodes 410-1 and 410-2.

The pulse signal generating portions 805-1 and 805-2 generate pulse signals for controlling light emission (ON) timing of the lower electrodes 410-1 and 410-2. The pulse signal generating portions 805-1 and 805-2 input the pulse signals to the driving portions 1001-1 and 1001-2 by way of the pulse signal lines 907-1 and 907-2.

The digital-to-analog converter (hereinafter referred to as DAC) 1002 supplies an analog voltage which determines a drive current to the driving portions 1001-1 and 1001-2 by way of the signal line 1003 based on the data set in the register portion 802. That is, the digital-to-analog converter 1002 functions as a voltage generating portion for forming the driving voltages applied to the lower electrodes 410-3 to 410-748. The driving portion selecting portion 1007 feeds a driving portion selection signal for selecting the driving portion 1001-1, 1001-2 on the basis of the data set in the register portion 802, to the driving portion 1001-1 and 1001-2 by way of the signal lines 1004 and 1005. The driving portion select signal is generated so that only the signal connected to the selected driving portion 1001 becomes high level. For example, when the driving portion 1001-1 is selected, a high-level driving portion select signal is supplied only to the signal line 1004, and a low level driving portion select signal is supplied to the signal line 1005 and other signal lines 1005 connected to other driving portions 1001-2 and the like. In the embodiment 1, the driving portion select signal is based on positive logic, but it may be negative logic.

The driving portions 1001-1 and 1001-2 each set the analog voltage inputted by way of the signal line 1003 at the timing selected by each driving portion selecting portion 1007 (the timing when the driving portion select signal becomes high level). The CPU 703 sequentially selects the driving portions 1001-1 and 1001-2 through the register portion 802 and sets the voltage corresponding to the selected driving portions 1001-1 and 1001-2. By this, the CPU 703 sets the analog voltage (driving voltage) of all the driving portions 1001 with one DAC 1002. The analog voltage and the pulse signal which determine the drive current are inputted to the driving portions 1001-1 and 1001-2 by the above-described operation, and to the lower electrodes 410-1 and 410-2, the voltages are independently applied by the drive circuit which will be described below.

(Driving Portion)

Part (b) of FIG. 11 shows a circuit of the driving portion 1001-1 for driving the lower electrode 410-1. Incidentally, the driving portions 1001 for the other lower electrodes are also driven by similar circuits. A MOS field effect transistor (hereinafter referred to as MOSFET) 1102 supplies a drive current to the lower electrode 410-1 depending on a gate voltage value, and when the gate voltage is at low level, the current is controlled so that the drive current is turned off (light off).

The pulse signal line 907-1 is connected to a gate terminal of the MOSFET 1104, and the voltage charged in a capacitor 1106 when the pulse signal is high level is delivered to the MOSFET 1102. The driving portion select signal (transmitted from the signal line 1004) transmitted from the driving portion selecting portion 1007 is connected to a gate terminal of the MOSFET 1107. The MOSFET 1107 turns on when the received driving portion select signal is at a high level, and charges the capacitor 1106 with the analog voltage (transmitted from the signal line 1003) outputted from the DAC 1002. In the embodiment 1, the DAC 1002 sets the analog voltage to the capacitor 1106 at the timing before the image formation and keeps the voltage level by turning off the MOSFET 1107 during an image formation period.

By such an operation, the MOSFET 1102 supplies the drive current to the lower electrode 410 depending on the set analog voltage and pulse signal. In the case where the input capacitance of the lower electrode 410-1 is large and the response speed when off is slow, the off speed can be increased by the MOSFET 1103. To the gate terminal of the MOSFET 1103, the signal obtained by logically inverting the pulse signal by the inverter 1105 is inputted. When the pulse signal is at low level, the gate terminal of MOSFET 1103 becomes high level to forcibly discharge the charge stored up to the input capacitance of the lower electrode 410-1.

As described above, in the embodiment 1, a constitution in which in the same silicon substrate 402, the light emitting region (area) 604 and the circuit portion 602 are provided is employed. By this, while suppressing costs of the wire bonding and the area of the wiring substrate, the driving signal generating circuit is provided for each lower electrode, so that it becomes possible to control the pulse width of the pulse signal and the light emitting timing in a minute time unit.

As described above, according to the embodiment 1, it is possible to suppress the costs of the wire bonding and the area of the wiring substrate.

Embodiment 2

[Pulse Signal Generating Portion]

Even in an embodiment 2, a structure of an entire image forming apparatus, a structure of an exposure head 106, and a structure of a silicon substrate 402 are similar to those in the embodiment 1. A difference from the embodiment 1 is a structure of a pulse signal generating portion 805, and therefore, of the pulse signal generating portion 805, a point of the difference from the embodiment 1 will be described. In the case where the number of the lower electrodes 410 is n, the number of the pulse signal generating portions 805 is also n which is the same as the number of the lower electrodes 410, but structures of the pulse signal generating portions 805 provided for the lower electrodes 410, respectively, are the same. For that reason, here, the pulse signal generating portion 805-1 will be described as an example.

Figure 12:
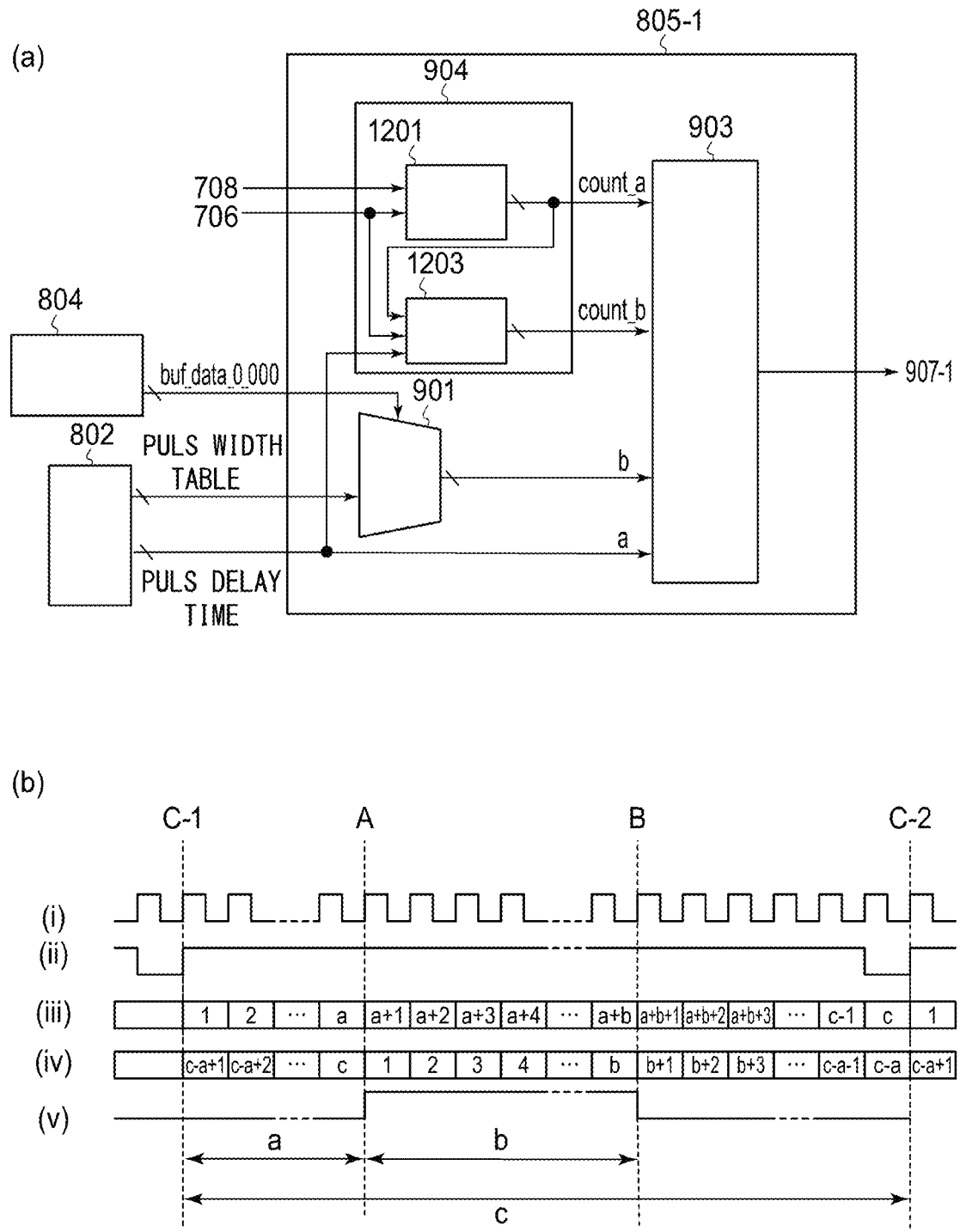
FIG. 12 includes an illustration of a pulse signal generating portion and a diagram showing a waveform of each signal.

Part (a) of FIG. 12 shows a block diagram of the pulse signal generating portion 805-1. A difference from the pulse signal generating portion 805-1 shown in part (a) of FIG. 9 is in that the input is provided with a pulse delay time a which is a first time sent from the register portion 802. The counter portion 904 in the embodiment 2 includes a pulse delay time counter 1201 and a pulse width counter 1203. An output of the pulse delay time counter 1201 is count_a, and an output of the pulse width counter 1203 is count_b. Operations of the counter portion 904 and the output determining portion 903 will be described using part (b) of FIG. 12. Here, (i), (ii) and (v) of part (b) of FIG. 12 are graphs similar to (i), (ii) and (iv) of part (b) of FIG. 9 and will be omitted from description. Part (iii) of part (b) of FIG. 12 shows a value of count_a which is an output of the pulse delay time counter 1201, and (iv) shows a value of count_b which is an output of the pulse width counter 1203.

The pulse delay time counter 1201 receives the clock signal clk and the line synchronization signal lsync-x, as input. The pulse delay time counter 1201 counts the clock signal clk and resets the count to 1 at a timing (timing C-1, C-2) when the line synchronization signal lsync_x is at the low level during the rising of the clock signal clk.

The pulse width counter 1203 receives the clock signal clk, the count_a, and the pulse delay time a, as an input. The pulse width counter 1203 counts the clock signal clk and resets the count to 1 at a timing (timing A) when the count_a coincides with the pulse delay time a during the rising of the clock signal clk. The counter portion 904 outputs the count_a and the count_b to the output determining portion 903.

The output determining portion 903 causes the pulse signal to be at the high level at the timing (timing A) when the count_a coincides with the pulse delay time a during the rising of the clock signal clk. On the other hand, the output determining portion 903 causes the pulse signal to be at the low level at a timing (timing B) when the count_b coincides with the pulse width b during the rising of the clock signal clk. By this, the output determining portion 903 generates the pulse signal delayed depending on the pulse delay time a.

The pulse delay time a is capable of changing a value thereof in a cycle of each clock signal clk (hereinafter, referred to as a clock signal cycle) unit by rewriting the memory of the register portion 802. In the embodiment 2, by resetting values of the count_a and the count_b are made 1, but are not required to be 1. Further, in the embodiment 2, the counting method of the clock signal clk is up-counting, but may be down-counting. Further, the case where the two counters are included in the counter portion 904 was described, but the number of the counters is not required to be 2, and for example, one counter may perform the operations of the pulse delay time counter 1201 and the pulse width counter 1203.

[Light Emitting Timing Control Depending on Position of Light Emitting Device]

By using the constitution of the embodiment 2, a method of controlling the light emitting timing depending on the position of the light emitting device 401 on the printed board 202 will be described. There is a case that a mounting position of the light emitting device is deviated from an original mounting position by the influence of mounting accuracy when the light emitting devices 401-1 to 401-20 on the printed board 202 in a staggered state. For that reason, the lower electrodes 410 are different in position, respectively, with respect to the short direction of the light emitting device 401. In the case where the positions of the lower electrodes 410 are deviated from each other, a deviation occurs on the printed image, and therefore, there is a need to make correction of the light emitting timing depending on the position of the lower electrode 410. Hereinafter, a method of making correction of the light emitting timing depending on the position of the lower electrode 410 will be described. The correction of the light emitting timing made in each of the light emitting devices 401-1 to 401-20 is the same, and therefore, here, this will be described using the light emitting device 401-1 as an example.

Figure 13:
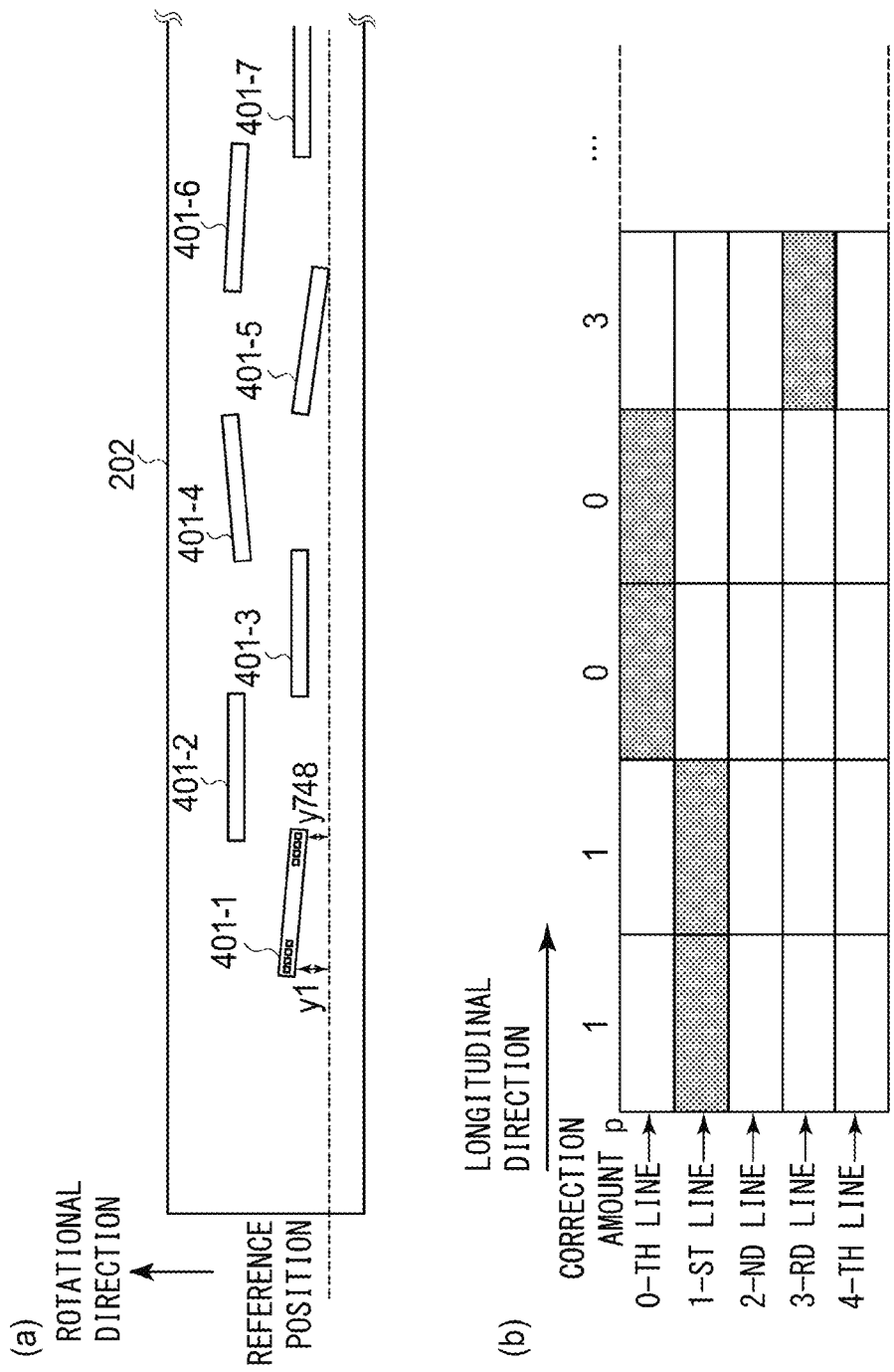
FIG. 13 includes a diagram showing a printed board and an illustration of a correction amount p.

Part (a) of FIG. 13 shows a part of an enlarged view of a lower electrode mounting surface of the printed board 202. The light emitting device 401-1 is mounted on the printed board 202, and thereafter the following values are measured. That is, a position y1 which is a first distance and a second position y748 which is a second distance, relative to a position as a basis for the lower electrode 410-1 at one end portion of the light emitting device 401-1 and the lower electrode 410-748 at the other end portion of the light emitting device 401-1 (hereinafter, reformed to as a reference position) are measured. The position y1 and the position y748 which were measured are stored as positional data in the head information storage portion 710. The position as the basis of the position y1 and the position y748 (hereinafter, referred to as the reference position), is, for example, a position on a mostupstream side of the rotational direction of the photosensitive drum 102 where the lower electrodes 410 are disposed when the light emitting devices 401-1 to 401-20 are mounted. In the embodiment 2, a position of a right-hand end lower electrode 410-748 of the light emitting device 401-5 in part (a) of FIG. 13 was used as the reference position shown by a broken line.

The CPU 703 calculates a correction amount for each lower electrode 410 by reading information on the position y1 and the position y748 of the light emitting devices 410-1 and 410-748 at opposite ends of the light emitting device 401-1 from the head information storage portion 710. For example, a position ym which is a third distance of an m-th light emitting device 410-m from a left-hand end of the light emitting device 401-1 in part (a) of FIG. 13 is capable of being acquired by the following formula (1).

$$ym = y1 + (m-1)(y748 - y1)/747 \quad \text{formula (1)}$$

Incidentally, positions y1 to y748 of all the lower electrodes 410 in the light emitting device 401-1 relative to the reference position are measured and may be stored as a correction amount for each lower electrode 410 in the head information storage portion 710. Further, the measurement of the positions of the opposite ends of the light emitting device 401 or all the lower electrodes 410 may be performed in the factory or may be performed after the exposure head 106 is mounted in the image forming apparatus.

The CPU 703 divides the correction amount for each lower electrode 410 into an amount of one line unit and an amount of less than one line with respect to the short direction of the light emitting device 401. Here, of the acquired correction amounts, the amount of the one line unit is a correction amount p corrected by the image controller portion 700, and the amount of less than the one line is a correction amount q corrected by the pulse signal generating portion 805. For example, the case where the CPU 703 acquires the correction amount for a certain lower electrode 410 as 110.8 μm will be described. Here, in the case where the resolution of the light emitting device 401 with respect to the short direction is 1200 dpi, of the correction amount of 110.8 μm, 105.8 μm corresponding to 5 lines is the correction amount p corrected in the image controller portion 700 (p=105.8 μm). That is, the correction amount p is an amount (for example, 105.8 μm) which is an integral multiple (=1, 2, . . . ) (for example, 5 times) of an amount (for example 21.16 μm) corresponding to a first resolution (for example, 1200 dpi). Further, of the correction amount of 110.8 μm, 5 μm which is the amount of less than the one line (an member corresponding to the first resolution) is the correction amount q corrected in the pulse signal generating portion 805 (q=5 μm).

The image controller portion 700 generates an image data reading timing signal depending on the correction amount p for each lower electrode 410 in the CPU 703, and outputs the signal to the chip data converting portion 702 via the signal line 709. The chip data converting portion 702 delays and outputs the image data on one line unit (basis) depending on the reading timing signal.

Output timing control of the image data depending on the correction amount p carried out by the image controller portion 700 will be described using part (b) of FIG. 13. The image controller portion 700 stores image data, generated by the image data generating portion 701, in the storing portion (not shown) in an amount corresponding to a plurality of lines. Part (b) of FIG. 13 is a diagram schematically showing the image data stored in the storing portion. A left-right direction of part (b) of FIG. 13 shows the longitudinal direction of the light emitting device 401. In part (b) of FIG. 13, each rectangular block represents image data for each of pixels stored in the storing portion, and a colored block represents image data to be outputted. For example, in a second block (lower electrode 410-2), the correction amount p is 1, and one line is corrected by the image controller portion 700, and the image data is outputted to the colored first line.

In the case where the correction amount p for the lower electrode 410 with respect to the longitudinal direction of the light emitting device 401 is n line(s), the CPU 703 generates a reading timing signal such that n-th line image data in part (b) of FIG. 13 in which the image data is delayed by the n line(s) is outputted. The chip data converting portion 702 reads and outputs image data (colored block of part (b) of FIG. 13) depending on the reading timing signal. By this, the image data of the line depending on the correction amount p can be outputted for each lower electrode 410 as shown in part (b) of FIG. 13. However, in part (b) of FIG. 13, as an example, the image data held in the storing (storage) portion (not shown) includes 5 lines (0-th to fourth lines) but is not required to be 5 lines. As described above, the image controller portion 700 functions as a correcting portion.

In the pulse signal generating portion 805, the correction is made by delaying the light emitting timing depending on the correction amount q for each lower electrode 410. The CPU 703 acquires a delay time by using a formula (2) when the correction amount q in the pulse signal generating portion 805 is converted to a delay time of the light emitting timing.

Delay time=(correction amount $q$/photosensitive drum surface speed)/clock signal cycle     formula (2)

The CPU 703 acquires the delay time for each lower electrode 410 and stores the delay time as a delay time a in the register portion 802. The pulse signal generating portion 805 generates the pulse signal at a light emitting timing depending on the pulse delay time a stored in the register portion 802, so that a difference (positional deviation during mounting) from the reference position for each lower electrode 410 at accuracy of (clock signal cycle)×(photosensitive drum surface speed).

Figure 14:
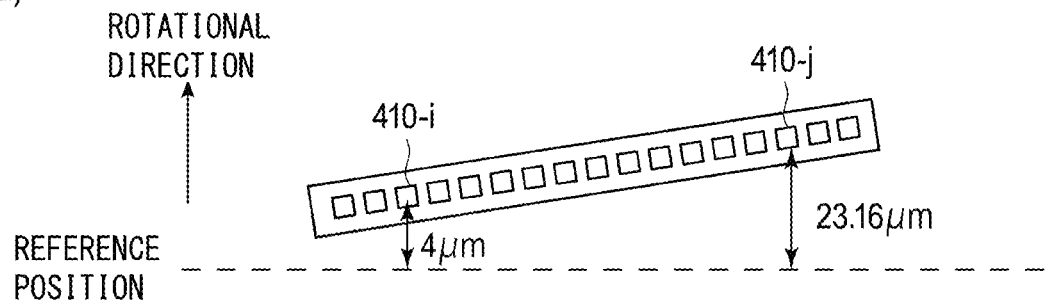
FIG. 14 includes a diagram showing positions of lower electrodes with respect to a short (side) direction and a waveform of each signal.
Figure 14:
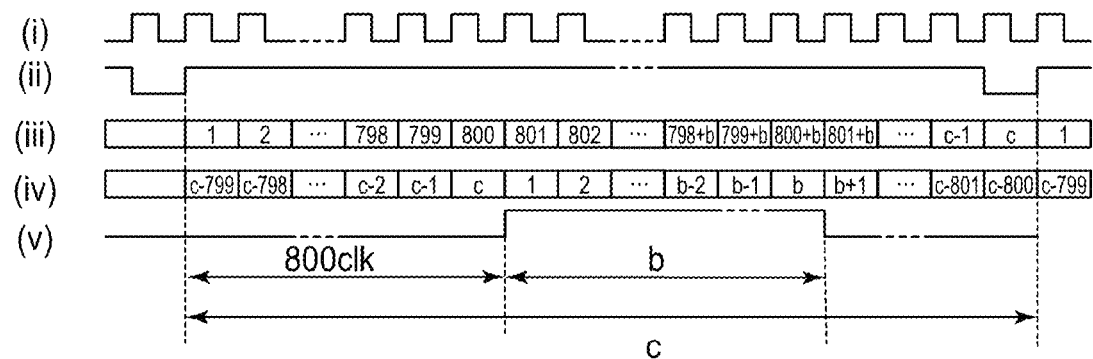
Figure 14:
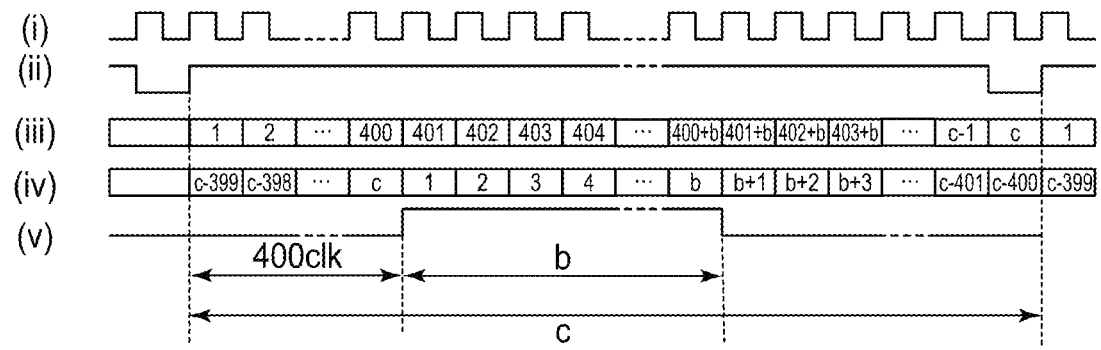

As an example, a method of correcting positions of a lower electrode 410-$i$ and a lower electrode 410-$j$ in a certain light emitting device 401 shown in part (a) of FIG. 14 will be described. However, in part (a) of FIG. 14, the number of lower electrodes in the light emitting device 401 is omitted. The resolution of the light emitting device 401 is 1200 dpi (about 21.16 μm), and the surface speed of the photosensitive drum 102 is 200 mm/s. Further, the line synchronization signal cycle is c, a clock signal frequency is 40 MHz, and pulse widths of pulse signals corresponding to the lower electrodes 410 are b.

(Lower Electrode 410-$i$)

A position yi relative to the reference position of the lower electrode 410-$i$ is 4 μm. At this time, the correction amount q at the pulse signal generating portion 805 becomes 4 μm, so that from the formula (2), the pulse delay time a is acquired as 800 clk. The pulse signal generating portion 805-1 generates a pulse signal represented by a timing chart of part (b) of FIG. 14. Here, (i) to (v) of part (b) of FIG. 14 are similar to (i) to (v) of part (b) of FIG. 12, and will be omitted from description.

(Lower Electrode 410-$j$)

Similarly, a position yj relative to the reference position of the lower electrode 410-$j$ is 23.16 The correction amount of 23.16 μm is divided into the correction amount p (one line) and the correction amount q (=2 μm=23.16 μm-21.16 μm). At this time, when it is assumed that the pulse signal generating portion 805 makes light emitting timing correction corresponding to 23.16 μm, the pulse delay time a becomes larger than the line synchronization signal cycle, so that a proper pulse signal is not outputted. For that reason, 21.16 μm corresponding to one line which is the correction amount p of one line unit with respect to the short direction of the light emitting device 401 is corrected in the image controller portion 700. By this, the correction amount q in the pulse signal generating portion 805 becomes 2 so that the pulse delay time a is acquired as 400 clk from the formula (2). The pulse signal generating portion 805-$j$ generates a pulse signal represented by a timing chart of part (c) of FIG. 14. Here, (i) to (v) of part (c) of FIG. 14 are similar to (i) to (v) of (b) of FIG. 12, and will be omitted from description.

Incidentally, not only the mounting positions of the light emitting devices 401-1 to 401-20, but also the mounting positions of the exposure heads 106 may be similarly measured, calculated, and corrected. Further, each of the measurement and the calculation may be made in the factory or in the image forming apparatus main assembly. The above-described control relating to the correction depending on each lower electrode 410 may be carried out for each lower electrode 410 or carried out for a unit in which some lower electrodes 410 are brought together. Further, a variation in light emitting amount of the light emitting layer 450 corresponding to each lower electrode 410 may also be corrected by the pulse signal (light emitting timing signal) generated by the pulse signal generating portion 805. As described above, depending on the position of each lower electrode 410, the correction of one line unit is made by the image controller portion 700, and the correction of less than one line is made in the pulse signal generating portion 805. By this, at accuracy of (clock signal cycle)×(photosensitive drum surface speed), it is possible to correct the deviation of the printed image due to the position of each lower electrode 410.

As described above, according to the embodiment 2, it is possible to suppress costs of the wire bonding and the area of the wiring substrate.

Embodiment 3

An embodiment 3 is different from the embodiment 1 in structure of the exposure head 106 and structure of the silicon substrate 402. Particularly, the embodiment 3 is different from the embodiment 1 in arrangement of lower electrodes, and a structure of a driving circuit provided on a silicon substrate of a lower electrode is partially different from the embodiment 1 and the embodiment 2. In the following, a point different from the embodiment 1 and the embodiment 2 will be described.

Figure 15:
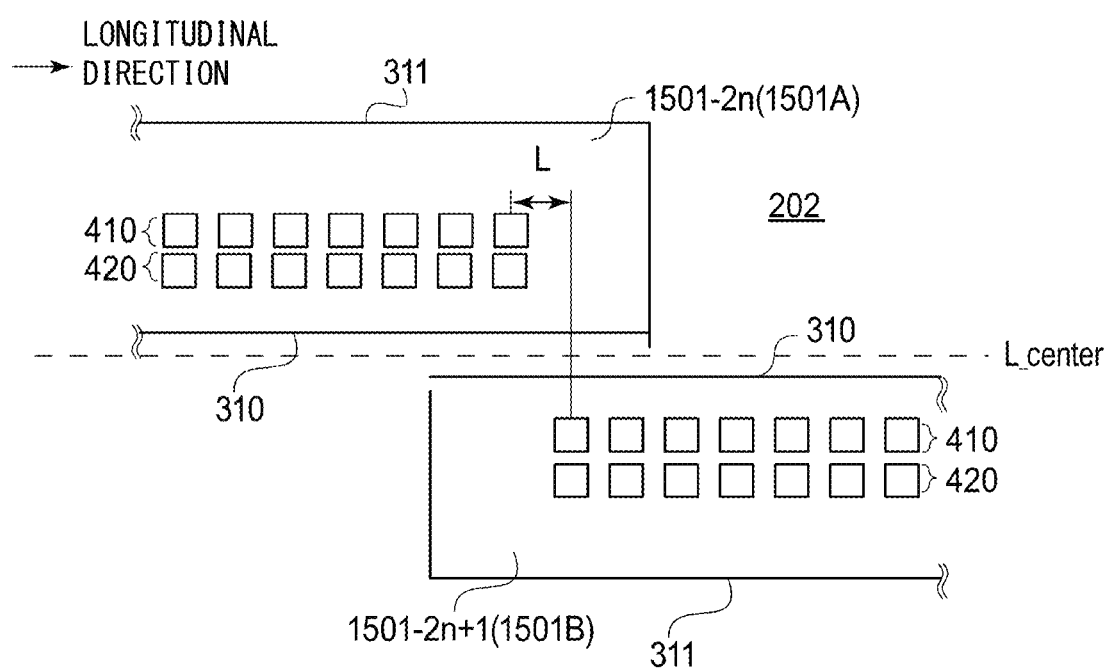
FIG. 15 is a diagram showing a modified example of the printed board.

FIG. 15 is a diagram showing a state of a boundary portion between chips of light emitting devices 1501 on which electrodes are arranged in two rows in the longitudinal direction and showing an arrangement of electrodes. Each light emitting device 1501 of this embodiment is provided with lower electrodes arranged in two row along the longitudinal direction. An interval between adjacent lower electrodes is similar to the interval in the embodiment 1.

[Structure of Light Emitting Area]

Figure 16:
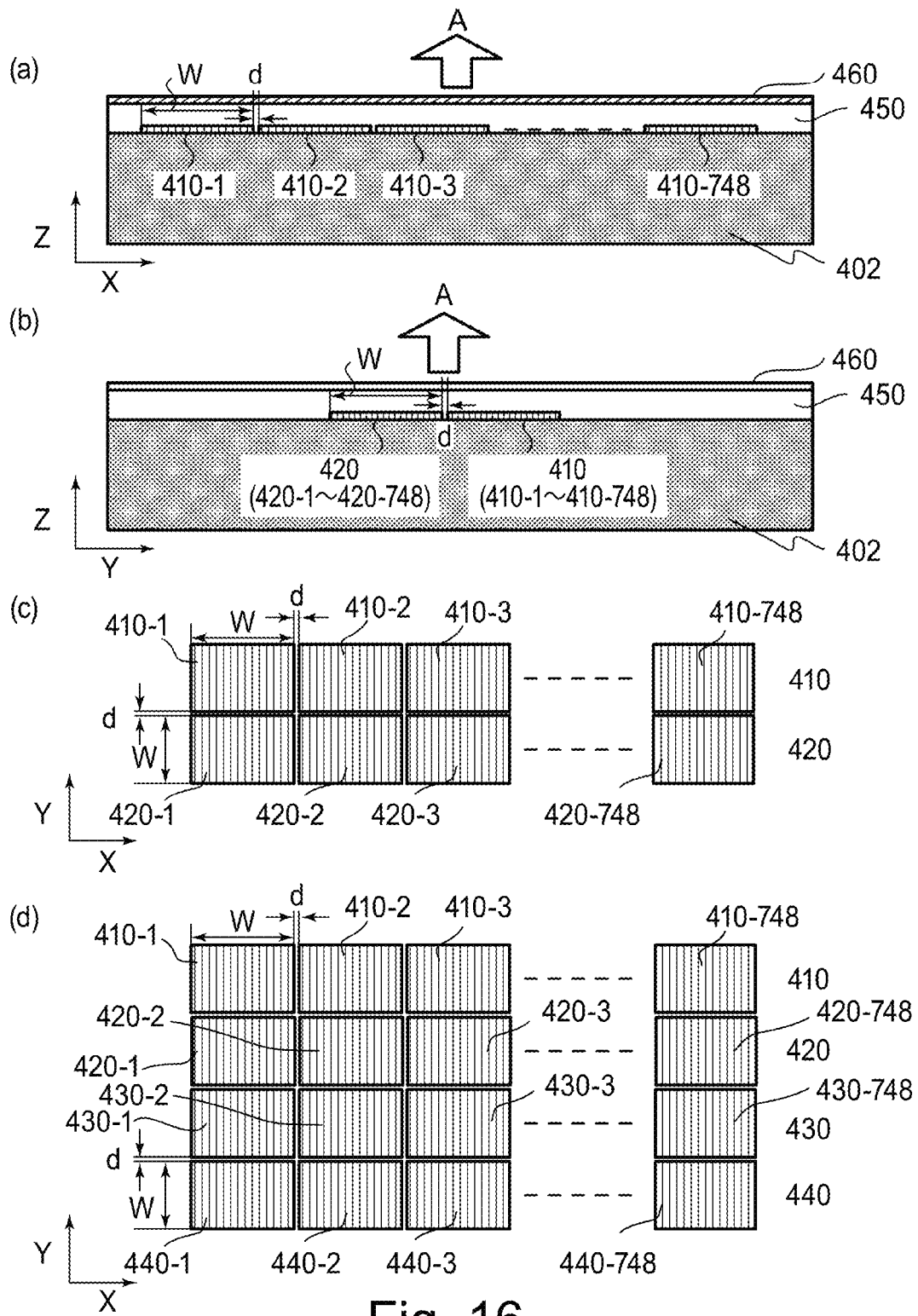
FIG. 16 includes sectional views of a light emitting area as a modified and structural diagrams of a light emitting device.

Using FIG. 16, the light emitting device 1501 will be described in more detail. The X direction in FIG. 16 indicates the longitudinal direction of the exposure head 106. A Z direction is the direction in which the layers of the layer structure described below overlap (laminating direction). Part (a) of FIG. 16 is an enlarged view of the major parts of the schematic view of a cross-section taken along a line A-A in FIG. 4. Part (a) of FIG. 16 is a schematic view of lower electrodes 410-1 to 410-748, which will be described hereinafter, as viewed in the Y direction. As shown in part (a) of FIG. 16 and part (c) of FIG. 16, the light emitting device 1501 includes a silicon substrate 1502, the lower electrodes 410-1 to 410-748, lower electrodes 420-1 to 420-748, the light emitting layer 450, and the upper electrode 460. The silicon substrate 402 is a drive substrate on which drive circuits including driving portions corresponding to the lower electrodes 410-1 to 410-748, respectively, which will be described hereinafter, are formed in the manufacturing process.

The lower electrodes 410-1 to 410-748 (cathodes) shown in part (a) of FIG. 16 and part (c) of FIG. 16 correspond to the lower electrodes disclosed in FIG. 5, and therefore, will be omitted from description.

As shown in FIG. 16, the light emitting device 1501 of this embodiment includes lower electrodes 420-1 to 420-748 in addition to the lower electrodes 410-1 to 410-748. The lower electrodes 420-1 to 420-748 are plurality of electrodes formed in layers (first electrode layer) on the silicon substrate 402, like the lower electrodes 410-1 to 410-748. The lower electrodes 420-1 to 420-748 are the second electrode row (AY). That is, the light emitting device 1501 includes lower electrodes arranged two-dimensionally. The lower electrodes 420-1 to 420-748 have the same size, shape, and arrangement in the X direction as those of the lower electrodes 410-1 to 410-748, and therefore, the description thereof will be omitted.

The lower electrodes 420-1 to 420-748 (second electrode array) are arranged in the Y direction with an interval d relative to the lower electrodes 410-1 to 410-748 (first electrode array). The lower electrode 420-1 is arranged adjacent to the lower electrode 410-1 in the Y direction, and similarly, the lower electrode 420-2 to the lower electrode 420-748 are arranged adjacent to the lower electrode 410-2 to the lower electrode 410-748, respectively. Incidentally, it is not always necessary to design the distance between the lower electrodes in the X direction and the distance between the lower electrodes in the Y direction to be the same as in this embodiment, but in order to arrange the lower electrodes efficiency within a predetermined area, the distance between the lower electrodes in both directions are preferably designed equal. Further, this embodiment exemplifies the light emitting device including two electrode rows for simplification of description, but as shown in part (d) of FIG. 16, the electrode row may be in any number of rows, that his, 3 or more. For example, similar to the structure described above, the lower electrodes 430-1 to 430-748 may be arranged adjacent to the lower electrodes 420-1 to 420-748, respectively, and further, the lower electrodes 440-1 to 440-748 may be arranged adjacent to the lower electrodes 430-1 to 430-748, respectively. In the following, in order to simplify the explanation, the light emitting device 1501 including the lower electrodes 410-1 to 410-748 and the lower electrodes 420-1 to 420-748 will be described as an example.

When the lower electrode 410-1 and the lower electrode 420-1 are simultaneously driven, a distance between center positions exposed by the driving of both electrodes on the photosensitive drum 102 is shifted by W+d in the rotational direction of the photosensitive drum 102. The image forming apparatus of this embodiment drives the plurality of lower electrodes (for example, the lower electrode 410-1 and the lower electrode 420-1) which are adjacent to each other in the rotational direction of the photosensitive drum 102, thereby exposing an area corresponding to certain one pixel in the output resolution of the image forming apparatus. For that reason, an area corresponding to one pixel can be exposed a plurality of times by providing a time difference between the timing of voltage application to the lower electrode 410-1 and the timing of voltage application to the lower electrode 420-1 depending on the rotation speed of the photosensitive drum 102 (multiple exposure).

Next, the light emitting layer 450 in this embodiment will be described. The light emitting layer 450 is formed by being laminated on the silicon substrate 402 on which the lower electrodes 410-1 to 410-748 and the lower electrodes 420-1 to 420-748 are formed. That is, in portions where the lower electrodes 410-1 to 410-748 and the lower electrodes 420-1 to 420-748 are formed, the light emitting layer 450 is laminated on the lower electrodes 410-1 to 410-748 and the lower electrodes 420-1 to 420-748. In a portion where they are not formed, the lower electrodes 410-1 to 410-748 and the lower electrodes 420-1 to 420-748 are laminated on the silicon substrate 402. In this embodiment, in the light emitting device 1501, the light emitting layer 450 is formed so as to extend over all of the lower electrodes 410-1 to 410-748 and the lower electrodes 420-1 to 420-748, but this embodiment is not limited thereto. For example, similarly to the lower electrodes 410-1 to 410-748 and the lower electrodes 420-1 to 420-748, the light emitting layer 450 may be formed so as to be separately laminated on each lower electrode, or the lower electrodes 410-1 to 410-748 and the lower electrodes 420-1 to 420-748 may be divided into a plurality of groups, and then, for each of the divided groups, one light emitting layer may be laminated on the lower electrode belonging to the group.

[Exposure Area (Driving) Shape of Multiple Exposure]

Figure 17:
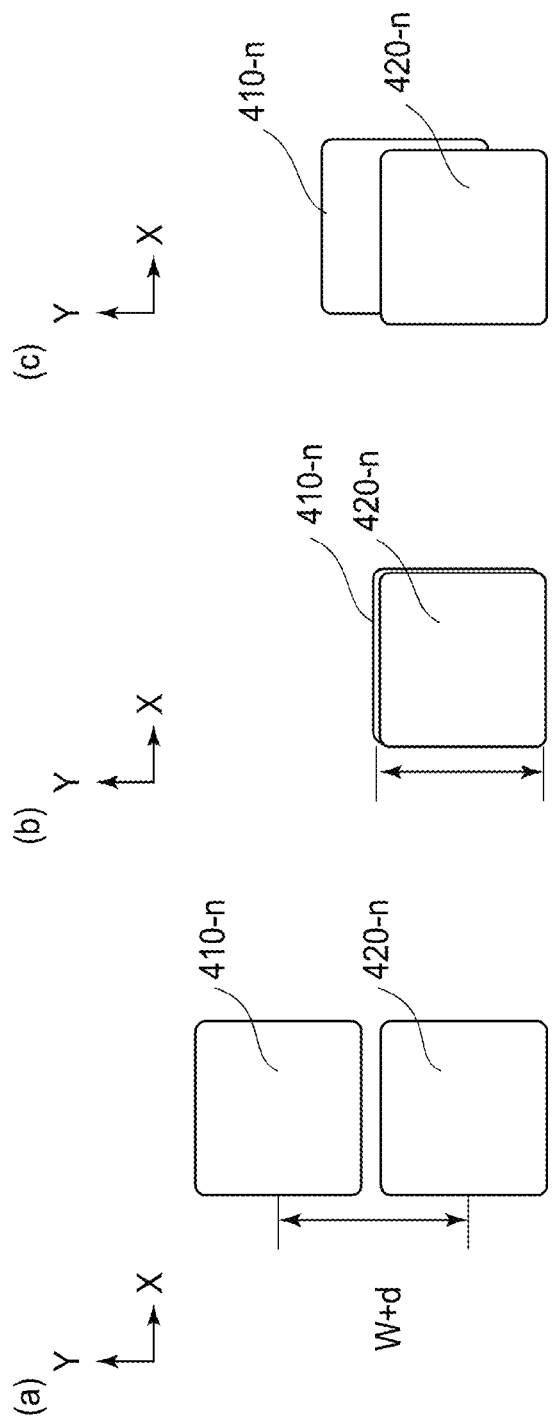
FIG. 17 includes conceptual diagrams of multiple-exposure.

FIG. 17 shows a positional relationship between exposure areas (spots) during multiple exposure. In FIG. 17, the exposure area on the exposure head 106 exposed by driving the lower electrode 410-$n$ ($n$ is natural number of $1 \le n \le 748$) and the lower electrode 420-$n$ adjacent thereto in the Y direction is shown. That is, FIG. 17 shows the exposure area of the two lower electrode 410-$n$ and lower electrode 420-$n$ arranged in the Y direction as regards n-th lower electrodes of the 748 lower electrodes arranged in the X direction. In the case where a voltage for causing the light emitting layer 450 is applied substantially simultaneously to the lower electrode 410-$n$ and the lower electrode 420-$n$ in the Y direction of the silicon substrate 402, the exposure area corresponding to the lower electrode 410-$n$ and the exposure area corresponding to the lower electrode 420-$n$ are in different positions as shown in part (a) of FIG. 17. The positions of the respective exposure areas are similar to an arrangement relationship between the lower electrode 410-$n$ and the lower electrode 420-$n$ in the Y direction. That is, a center distance of the exposure areas in the Y direction becomes W (μm)+d (μm).

Part (b) of FIG. 17 shows a state of the exposure areas when a timing of application of the electric charge to the lower electrode 420-$n$ pulse disposed so as to expose a side downstream of the lower electrode 410-$n$ in the rotational direction of the photosensitive drum 102 (hereinafter, referred to as lighting timing) is delayed in accordance with a formula (1) depending on the rotational direction of the photosensitive drum 102 and a rotation speed Vdr (mm/s). A timing T when the positions of the exposure areas formed on the photosensitive drum 102 coincide with each other is controlled on the basis of a delay time Tdelay acquired by the formula (1).

$$T\text{delay}=((W+d)/1000)/Vdr \qquad \text{formula (1)}$$

Further, in this embodiment, a maximum value Tw of a light emitting time of each lower electrode corresponding to each pixel is represented by a formula (2) by the resolution (for example, 1200 dpi) and the rotation speed Vdr since the light emitting signal is generated so that the light emitting time is equal to a time corresponding to an interval of one line with respect to the Y direction.

$$Tw=(25.4/1200)/Vdr \qquad \text{formula (2)}$$

By the multiple exposure, exposure can be made substantially at the same position on the photosensitive drum 102 by using the lower electrode 410-$n$ and the lower electrode 420-$n$, so that it becomes possible that the light quantity received by the photosensitive drum 102 is increased in proportion to the number of the lower electrodes disposed in the Y direction. Incidentally, in order to maintain such an effect, it is preferable that a deviation in exposure area position of each lower electrode subjected to the multiple exposure on the photosensitive drum 102 is small.

Part (c) of FIG. 17 shows an example in which the positions of the exposure areas on the photosensitive drum 102 in the multiple exposure are deviated from each other. In this example, the two exposure areas by the multiple exposure do not completely overlap with each other, but are in a partially overlapping state. Ideally, it is preferable that the two exposure areas substantially coincide with each other (completely overlap with each other) since dots are sharply (clearly) formed as shown in part (b) of FIG. 17. However, even in the case where the exposure areas partially overlap with each other as shown in part (c) of FIG. 17, although a dot sharpness property is deteriorated compared with part (b) of FIG. 17, a necessary density can be obtained.

For this reason, it is assumed that the time Tdelay is such that even in the case where a control variation occurs, the light emitting timing is controlled within an allowable error amount ΔT of the light emitting timing so as to fall within a range of a formula (3) with respect to an exposure area size Ws (μm).

$$\Delta T=(Ws/1000)/Vdr \qquad \text{formula (3)}$$

[Control Block]

Figure 18:
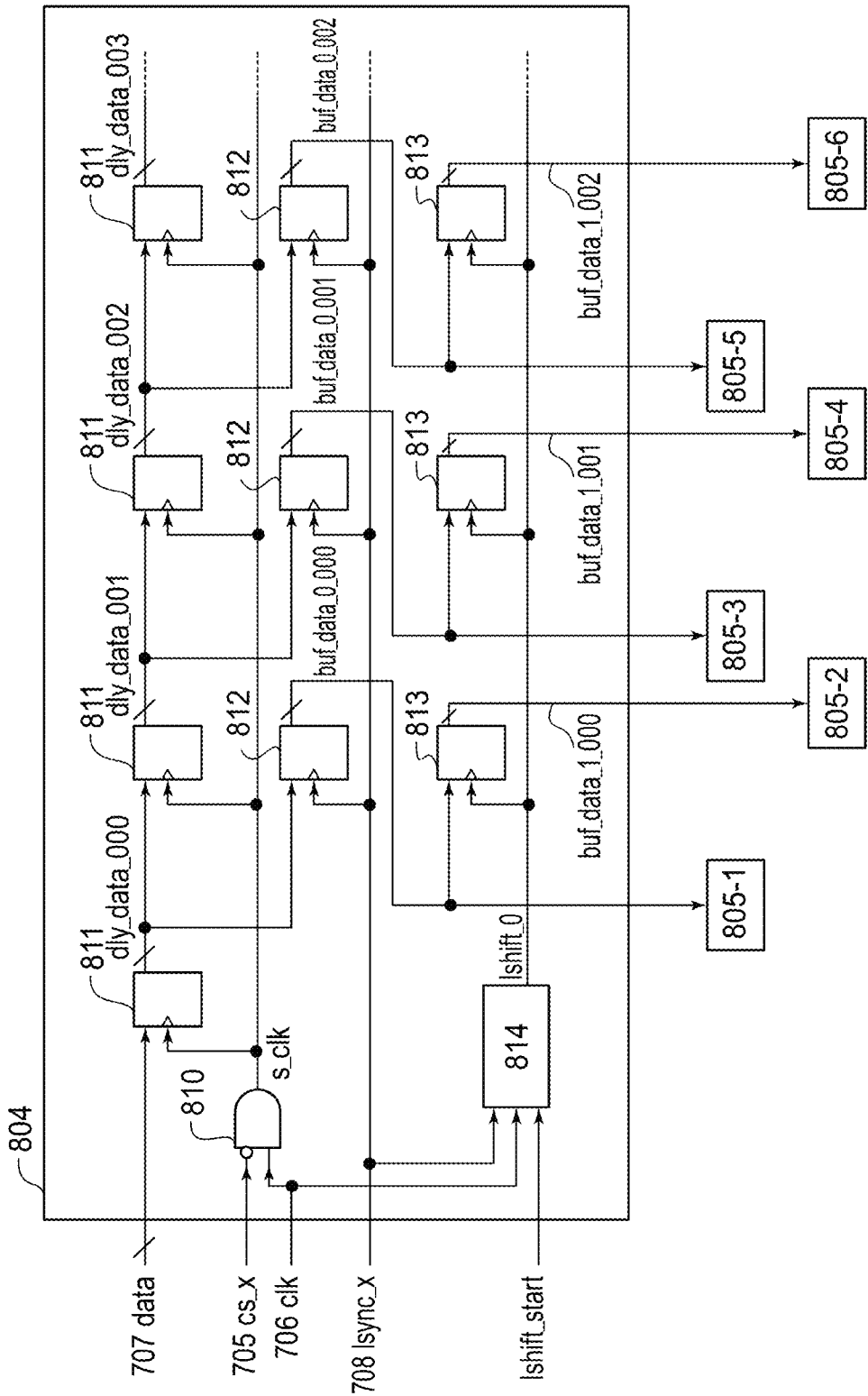
FIG. 18 is a diagram showing a modified example of a circuit in a light emitting device.

FIG. 18 shows a block diagram of the image controller portion 700 and the printed board 202. In the following, a chip select signal is ex_x, a line synchronization signal is lsync_x, a block signal is clk, and an image data signal is data. In this embodiment, processing of a single color will be described for simplification of an explanation, but, similar processing is performed in parallel for the four colors.

[Circuit Structure in Light Emitting Device]

A circuit block diagram in the light emitting device 1501 is shown in part (a) of FIG. 18. The circuit portion 602 in the light emitting device 1501 has a digital portion 800 and an analog portion 806. The digital portion 800 has a function of generating a pulse signal for driving the lower electrodes 410-$n$ and 420-$n$ based on the set value preset by the communication signal and various signals in synchronization with the clock signal clk, and sending, the generated pulse signal through the pulse signal line 907, to the analog portion 806. Here, the various signals refer to the chip select signal cs_x, the image data signal data, and the like synchronization signal lsync_x. Further, the digital portion 800 has a function of generating a chip select signal for a subsequent light emitting device 1501 from the inputted chip select signal cs_x.

[Digital Part]

The communication IF portion 801 controls writing and reading of the set value for the register portion 802 on the basis of a communication signal from the CPU 703. The register portion 802 stores the value necessary for the operation (set value preset in advance). This set value includes exposure timing information usable with the data storage portion 804, width and phase information of the pulse signal generated by the pulse signal generating portion 805, and set information of the drive voltage set by the analog portion 806, and the like. Incidentally, the drive voltage can be derived from a resistance value between the lower electrode and the upper electrode, and a range of this resistance value is determined in advance, and therefore, information about the drive current may be stored instead of the drive voltage setting information. The register portion 802 stores at least one of these pieces of information. The chip select signal generating portion 803 which is a first generating portion delays the inputted chip select signal cs_x which is a first signal, and generates the chip select signal for the subsequent light emitting device 1501, and sends the generated chip select signal via the signal line 711. The data storage portion 804 receives, via the data signal line 707, and holds the image data outputted by the image controller 700 during the period in which the inputted chip select signal cs_x is valid, and outputs the image data to the pulse signal generating portion 805 in synchronization with the line synchronization signal lsync_x. Details will be described hereinafter.

The pulse signal generating portion 805 generates a pulse signal on the basis of pulse signal width information and phase information set in the register portion 802 depending on the image data inputted from the data storage portion 804, and outputs it to the analog portion 806. Details will be described hereinafter. The analog portion 806 generates a signal required to drive the lower electrode on the basis of the pulse signal generated by the digital portion 800. Details will be described hereinafter.

(Data Storage Portion)

Next, the operation of the data storage portion 804 will be described. The data storage portion 804 of the embodiment 1 is built in the light emitting device 1501. An example in which the chip select signal cs_x and line synchronization signal lsync_x are negative logic signals will be described, but these signals may also be positive logic signals. Part (b) of FIG. 18 is a circuit structure diagram of the data storage portion 804. The clock gate circuit 810 outputs the logical product of an inverted signal of the chip select signal cs_x and the clock signal clk. The clock gate circuit 810 outputs the clock signal s_clk to a flip-flop circuit 811 only when the chip select signal cs_x is valid.

The flip-flop circuit 811 receives the image data signal data inputted to the data storage portion 804, as an original input. The same number of flip-flop circuits 811 as the lower electrodes 410 and 420 provided in the longitudinal direction of the light emitting device 1501 (748 in this embodiment) are connected in series. The flip-flop circuit 811 operates in accordance with the clock signal s_clk fed from the clock gate circuit 810. The output of the flip-flop circuit 811 is outputted as image data dly_data_000 to dly_data_747 to the next adjacent flip-flop circuit 811 and the flip-flop circuit 812. The flip-flop circuit 811 and 812 are provided correspondingly to the number of the lower electrodes (748 in this embodiment) in the longitudinal direction of the lower electrodes 410 and 420.

The flip-flop circuit 812 receives the output of the flip-flop circuit 811 as an input, and operates depending on the line synchronization signal lsync_x. The output of the flip-flop circuit 812 is outputted to the pulse signal generating portions 805 (805-1, 805-3, 805-5, . . . ) and to the flip-flop circuits 813, as image data buf_data_0_000 to buf_data_0_747. Each of the flip-flop circuits 812 functions as a memory circuit, and the flip-flop circuits 812 provided for one lower electrode array (lower electrodes 410-1 to 410-748) function as a memory circuit group (or a first memory circuit group). The pulse signal generating portions 805-1, 805-3, 805-5, . . . and so on function as a first pulse signal generating portion group which generates the first pulse signal. Incidentally, the pulse signal generating portion 805-1 generates pulse signal for driving the lower electrode 410-1, and the pulse signal generating portion 805-3 generates a pulse signal for driving the lower electrode 410-2. Further, the pulse signal generating portion 805-5 generates a pulse signal for driving the lower electrode 410-3.

The flip-flop circuit 813 receives the output of the flip-flop circuit 812 as an input, and operates depending on a multiple-exposure timing signal lshift_0. The output of the flip-flop circuit 813 is outputted as image data buf_data_1_000 to buf_data_1_747 to the pulse signal generating portion 805 (805-2, 805-4, 805-6, . . . ). Each of the flip-flop circuits 813 functions as a memory circuit, and the flip-flop circuits 813 provided for one lower electrode array (420-1 to 420-748) function as a memory circuit group (or a second memory circuit group). The pulse signal generating portions 805-2, 805-4, 805-6, . . . , function as a second pulse signal generating portion group that generates the second pulse signal. Incidentally, the pulse signal generating portion 805-2 generates a pulse signal for driving the lower electrode 420-1, and the pulse signal generating portion 805-4 generates a pulse signal for driving the lower electrode 420-2. Further, the pulse signal generating portion 805-6 generates a pulse signal for driving the lower electrode 420-3.

That is, the flip-flop circuit 811, the flip-flop circuit 812, and the flip-flop circuit 813 function as memories for temporarily storing driving data for controlling voltages applied to the lower electrodes.

A multiple timing signal generating portion 814 which is a first generating portion generates the multiple-exposure timing signal lshift_0 which is a timing signal on the basis of the line synchronization signal lsync_x, the clock signal clk, and a multiple timing setting signal lshift_start. That is, the multiple timing signal generating portion 814 generates the multiple-exposure timing signal lshift_0 for generating pulse signals by the pulse signal generating portions 805-2, 805-4, . . . at timings different from timings of the pulse signal generating portions 805-1, 805-3, . . . . In this embodiment, the multiple timing signal generating portion 814 generates the multiple-exposure timing signal lshift_-by delaying the line synchronization signal lsync_x by an amount corresponding to a set value set as the multiple timing setting signal lshiftstart. For example, when the multiple timing setting signal lshiftstart is set at 1 (lshiftstart=1), the multiple-exposure timing signal lshift_0 becomes a signal such that the line synchronization signal lsync_x is delayed by an amount corresponding to one cycle of the clock signal clk. The multiple timing signal generating portion 814 generates the multiple-exposure timing signal lshift_0 on the basis of the rotation speed of the photosensitive drum 102. That is, the multiple timing setting signal lshift_start is set on the basis of the delay time Tdelay acquired by the above-described formula (1).

Figure 19:
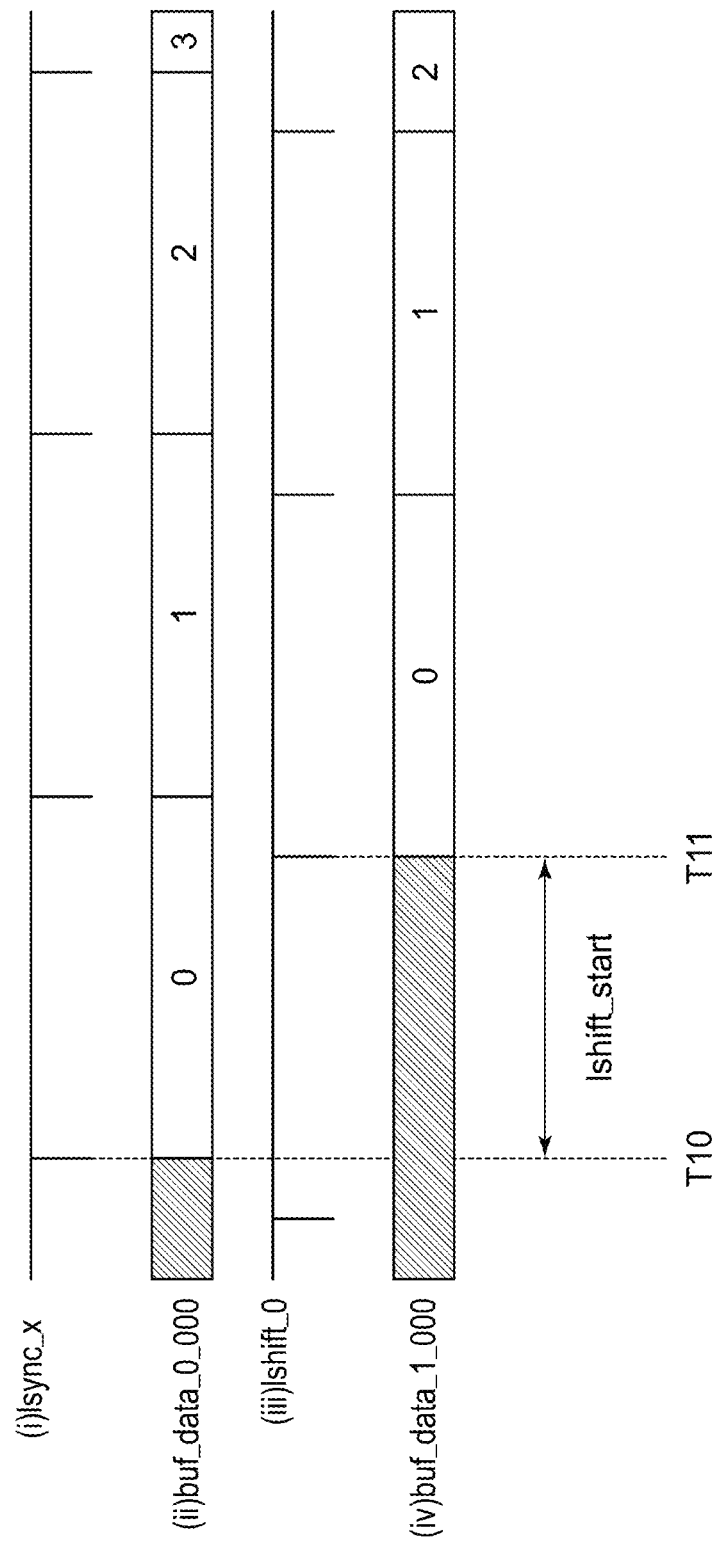
FIG. 19 is a diagram showing a waveform of each signal and image data in the multiple-exposure.

FIG. 19 is a timing chart showing an operation of the data storage portion 804 with respect to the Y direction. FIG. 19 shows the waveform of the line synchronization signal lsync_x in (i), and the image data buf_data_0_000 or the like which is an output of the flip-flop circuit 812 in (ii), the waveform of the multiple-exposure timing signal lshift_0 in (iii), and the image data buf_data_1_000 or the like which is an output of the flip-flop circuit 813 in (iv). In FIG. 19, as a representative, the image data buf_data_0_000 which is the output of the flip-flop circuit 812 positioned at a leftmost end of part (b) of FIG. 18, and the image data buf_data_1_000 which is the output of the flip-flop circuit 813 will be described. Incidentally, all the image data buf_data_0_001 to buf_data_0_747 and buf_data_1_001 to buf_data_1_747 are similar thereto.

As described in FIG. 8, at a time T10 of FIG. 19 which is a timing when the line synchronization signal lsync=0 holds at a time T0 of FIG. 8, image data dly_data_000 is inputted to the flip-flop circuit 812. Then, a value of the image data dly_data_000 is outputted as the image data bufdata_0_000 from the flip-flop circuit 812. At a time T11, the multiple-exposure timing signal lshift_0 is inputted as a low level (Ishift_0=0) to the flip-flop circuit 813. Then, a value of the image data buf_data_0_000 outputted from the flip-flop circuit 812 is outputted as image data buf_data_1_000 from the flip-flop circuit 813 to the pulse signal generating portion 805. Thus, the data outputted as the buf_data_0_000 to the pulse signal generating portion 805 at the lsync_x=0 is outputted as buf_data_1_000 to the pulse signal generating portion 805 again at a timing of subsequent Ishift_0=0. Here, the time T11 when the multiple-exposure timing signal Ishift_0 becomes the low level is a timing delayed from the time T10 when the line synchronization signal lsync_x became the low level, by a time corresponding to the multiple timing setting signal Ishift_start. The image data buf_data_0_000 is outputted to the pulse signal generating portion 805 corresponding to the lower electrode used in earlier exposure on the photosensitive drum 102 in the Y direction. Further, the image data buf_data_1_000 is outputted to the pulse signal generating portion 805 corresponding to the lower electrode used in later exposure on the photosensitive drum 102 in the Y direction. By this, multiple-exposure is realized.

In this embodiment, description was made by using, as an example, a constitution in which the two lower electrode 410-*n* and lower electrode 420-*n* were arranged in the Y direction, but the number of the lower electrodes used in the multiple-exposure is not limited to two. In the case where the number of the lower electrodes used in the multiple-exposure is increased (in the case where the lower electrodes are arranged in m=3 or more rows for the multiple-exposure), the flip-flop circuits 812 (748 pieces) and 813 (748) shown in part (b) of FIG. 18 may only be required to be increased to those corresponding to them rows (m×748 pieces). By this, image data corresponding to the lower electrodes corresponding to them rows (m×748 pieces) are capable of being held. Further, the pulse signal generating portions 805 connected to the flip-flop circuits corresponding to them rows are also increased to those corresponding to them rows (m×748 pieces), so that the respective lower electrodes corresponding to them rows (m×748 pieces) are capable of being controlled in light emitting timing and it becomes possible to perform the multiple-exposure corresponding to them rows.

In this embodiment, as a means for holding the image data of the respective lower electrodes, the flip-flop circuits were described as an example. In this constitution, the flip-flop circuits are disposed along the lower electrodes 410-1 to 410-748, a circuit which is simpler and which is small in wiring area is constituted. On the other hand, even when the flip-flop circuits are not used, the following constitution can be employed. That is, when a memory circuit (for example, RAM or the like) corresponding to the lower electrodes and a controller for controlling a reading timing and a writing timing to the memory circuit are provided, the flip-flop circuits are not necessarily be required to be used.

It becomes possible to carry out a more dynamic control of the light quantity by increasing the number of the lower electrodes used in the multiple-exposure and by making the number of lower electrode rows (arrays) used in the multiple-exposure selectable. For example, in the case of a constitution in which the number m of the lower electrode arrays is made m=10 and the lower electrodes are arranged in the Y direction, depending on an image forming speed of the image forming apparatus, the lower electrode arrays used in the multiple-exposure are capable of being selected from 2 rows to 10 rows. By this, a change in light output at 9 levels becomes possible. Accordingly, a control range of a driving current for each lower electrode can be made small, so that the lower electrode can be driven always under the substantially same driving current condition. For example, when the lower electrode is driven at a low current (i.e., at a low light quantity), response of the lower electrode becomes slow, so that there is a case that a predetermined light quantity cannot be obtained. For such a case, stable drive of the lower electrode becomes possible by using the multiple-exposure of this embodiment. Thus, in the case where selection as to whether the lower electrode in which row of a plurality of rows is used is made, a constitution in which a reset circuit is added to the flip-flop circuits 812, 813, and the like and output of the image data is selectively stopped may only be required to be employed. As a method other than such a method, a means for stopping the output of the pulse signal may also be added to the pulse signal generating portion 805.

As regards the analog portion 806 shown in part (a) of FIG. 18, a constitution of the analog portion for each of the lower electrodes is a constitution similar to part (b) of FIG. 11 of the embodiment 1, and therefore, description will be omitted.

[Switching of Lower Electrode in Driving Direction (Measures to Staggered Arrangement]

As described above, in this embodiment, a constitution in which the light emitting devices 1501 are arranged on the printed board 202 in a staggered shape (hereinbelow, referred to as a staggered arrangement) is used as an example. In the case where the light emitting devices 1501 are disposed in the staggered arrangement, with respect to a lens center of the rod lens array 203 with respect to the short diagram, by disposing the lower electrodes so as to be close to the center, a good imaging characteristic is obtained. In the case where an inexpensive rod lens array is used, there is a limit to an opening of the rod lines, and therefore, when the lower electrode arrangement is excessively away from the rod lens center, light does not reach the opening of the rod lens, so that the light cannot be emitted onto the photosensitive drum 102 in some cases. For that reason, a constitution in which the lower electrode arrays are disposed by being shifted to one side than the center of the light emitting device 1501 in the short direction and in which each lower electrode array is disposed close to the rod lens center to the extent possible is effective.

In part (c) of FIG. 15, the center (line) of the rod lens arrays 203 in the short direction is represented as L_center by a broken line. The rod lens arrays 203 and the light emitting devices 1501 are mounted so that a center line (hereinbelow, referred to as the center line) L_center rod lens arrays 203 in the short direction and a center (line) of the two light emitting devices 1501 disposed in the staggered arrangement coincide with each other. The lower electrodes of each light emitting device 1501 are shifted and arranged at positions closer to the center line L_center than the center of the light emitting device 1501. Here, in a light emitting device 1501A (one first substrate), a surface on a far side from a light emitting device 1501B is an end surface 311, and a surface on a near side to the light emitting device 1501B is an end surface 310. Further, in the light emitting device 1501B (the other first substrate), a surface on a far side from the light emitting device 1501A is an end surface 311, and a surface on a near side to the light emitting device 1501A is an end surface 310. In either light emitting device 1501, the lower electrodes 410 and 420 are shifted and arranged toward the end surface 310 side.

By thus-disposing the lower electrodes 410 and 420, either lower electrodes are disposed so that the light enters the openings of the rod lens arrays 203. Further, in this embodiment, the lower electrodes in the light emitting device 1501 are arranged at the positions shifted to one side than the center in the short direction of the light emitting device 1501. In either light emitting device 1501, a mounting direction of the light emitting device 1501 is determined so that the end surface 310 is on the center line L_center side. That is, in the silicon substrate 402, a plurality of lower electrodes 410 and 420 are disposed on a side close to the center (center line L_center) of the rod lens arrays 203 in the short direction. In the case where the light emitting devices 1501 are disposed in the staggered arrangement in two rows, these light emitting devices are disposed so that light emitting points approach the center line L_center in a state in which the light emitting points are reversed 180° from each other between the light emitting device 1501A and the light emitting device 1501B.

Thus, the mounting direction of the light emitting device 1501 is determined so that the positions of the lower electrodes are shifted to one side in the light emitting device 1501 and the lower electrodes approach the center line L_center. By this, it becomes possible to obtain a good imaging characteristic. On the other hand, as described above, by disposing the light emitting devices in different directions for each of the light emitting devices 1501, there is a need to control the order of drive of the lower electrodes with respect to the Y direction in conformity to the directions of the light emitting devices 1501. For example, as regards the light emitting device 1501A, the lower electrodes on a side (upper side in the figure) close to the end surface 311 is driven early, and as regards the light emitting device 1501B, the lower electrodes on a side (upper side in the figure) close to the end surface 310 are driven early. A control method in such a case will be described below.

(Circuit Including Selector)

Figure 20:
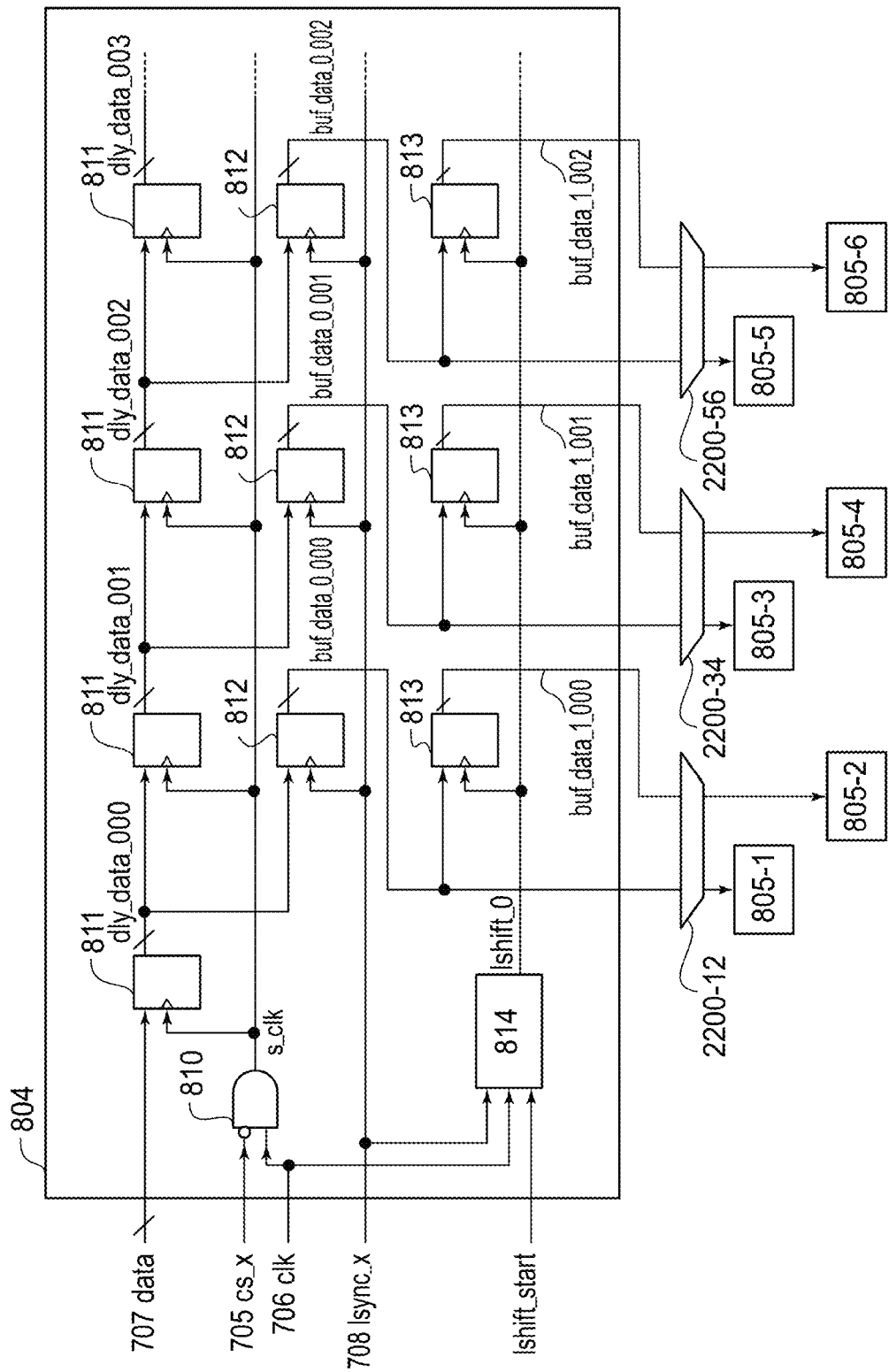
FIG. 20 is a diagram showing a modified example of a circuit in a light emitting device for switching an order of light emission.

FIG. 20 is a circuit block diagram at an inside portion of the light emitting device 1501 in which the light emitting order of the lower electrodes 410-1 to 410-748 are switched in the short direction of the printed board 202. Similarly as part (b) of FIG. 18, the case where the lower electrodes 410-1 and 410-748 and the lower electrodes 420-1 to 420-748 disposed in the two rows in the Y direction are provided will be described. In addition to the circuit constitution described in part (b) of FIG. 18, the data storage portion 804 includes selectors 2200-12, 2200-34, 2200-56, . . . . The selector 2200-12 switches a combination of connection of the flip-flop circuit 812 and the flip-flop circuit 813 with the pulse signal generating portion 805-1 and the pulse signal generating portion 805-2. The selector 2200-34 switches a combination of connection of the flip-flop circuit 812 and the FFC 813 with the pulse signal generating portion 805-3 and the pulse signal generating portion 805-4. The selector 2200-56 switches a combination of connection of the flip-flop circuit 812 and the flip-flop circuit 813 with the pulse signal generating portion 805-5 and the pulse signal generating portion 805-6.

The selectors 2200-12, 2200-34, 2200-56, . . . are collectively referred to as a selector 2200. The selector 2200 is capable of switching a connection relationship of the flip-flop circuits 812 and 813 with the pulse signal generating portions 805 which are transmission designations of the image data. That is, the selector 2200 functions as a selecting portion for selecting a connection combination between the first memory circuit group and the second memory circuit group with the first pulse signal generating portion group and the second pulse signal generating portion group.

For example, in one light emitting device 1501 in the longitudinal direction of the staggered arrangement, the flip-flop circuit 812 is connected to the pulse signal generating portion 805-1, and the flip-flop circuit 813 is connected to the pulse signal generating portion 805-2. In the other light emitting device 1501 in the longitudinal direction of the staggered arrangement, the flip-flop circuit 812 is connected to the pulse signal generating portion 805-2, and the flip-flop circuit 813 is connected to the pulse signal generating portion 805-1. The connection information of the selector 2200 is set in a predetermined register of the register portion 802 on the basis of a communication signal from the CPU 703. Connection of the selector 2200 is controlled on the basis of the connection information set in the register portion 802.

As described above, by possessing the means for switching the order of drive of the lower electrodes, irrespective of the arrangement direction of the light emitting devices 1501 on the printed board 202, it becomes possible to perform the multiple-exposure. In this embodiment, usefulness as to the staggered arrangement was described, but the staggered arrangement is also useful when the same exposure head is used in a plurality of different image forming apparatuses. The order of the drive of the lower electrodes is selected depending on the rotational direction of the photosensitive drum 102 and the mounting direction of the exposure head. By this, even in the image forming apparatus in which the rotational direction of the photosensitive drum 102 is different, it becomes possible to use the same exposure head.

As described above, in this embodiment, the lower electrodes are arranged in the Y direction and the multiple-exposure is performed, so that high output of the light output of the exposure head is possible, and it becomes possible to meet speed-up of the image forming apparatus and a photosensitive material requiring a more light quantity. By constituting the lower electrode array and the circuit portion 602 on the silicon substrate, it becomes possible to realize high definition of output resolution and high performance of control by enablement of built-in with a large-scale logic circuit of the light emitting device.

Further, in the silicon substrate 402, a means for generating the image data for performing the multiple-exposure is provided. By this, it is possible to generate necessary image data without increasing wiring (wire bonding) of the interface of the light emitting device 1501. By optimally disposing the memory circuit, it becomes possible to optimize a wiring area. Further, the light emitting timing can be controlled depending on the printing speed and the resolution of the image forming apparatus, and the interval of the lower electrodes of the light emitting device 1501. By this, an exposure region by the multiple-exposure on the photosensitive drum 102 can be made sharp (clear).

As described above, according to this embodiment, it is possible to propose the exposure head capable of being driven at a high speed with higher light output.

Embodiment 4

Next, an image data transfer method from the image controller portion 700 to each light emitting device 401 by using the above-described chip select signals will be described using the constitution of the embodiment 1 as an example. Incidentally, the image data transfer method in this embodiment is also applicable to the light emitting device 401 of the embodiment 2 and the light emitting device 1501 of the embodiment 3.

Figure 21:
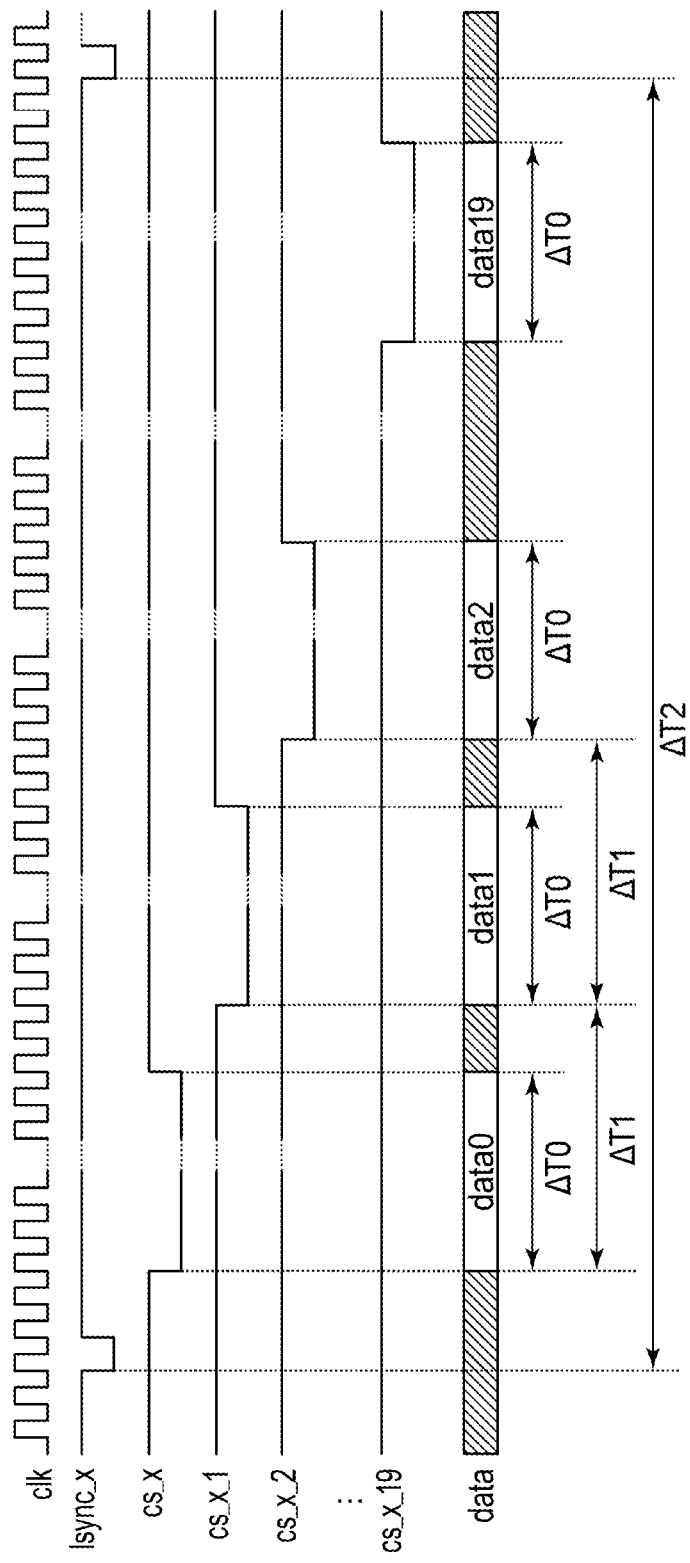
FIG. 21 is a timing chart for illustrating a chip select signal.

FIG. 21 is a timing chart showing a relationship between the chip select signals, the clock signal clk, the line synchronization signal lsync_x, and the image data signal data.

In FIG. 21, cs_x represents the signal line 705 of FIG. 6, cs_x_1, represents a chip select signal inputted to the light emitting device 401-2 via the signal line 711-1 of FIG. 6, cs_x_2 represents a chip select signal inputted to the light emitting device 401-3 via the signal line 711-2 of FIG. 6, and cs_x_19 represents a chip select signal inputted to the light emitting device 401-20, respectively. Further, image data for driving the lower electrodes in an n-th light emitting device 401-n correspondingly to one line is represented by data (n−1). For example, the image data for driving the lower electrodes in the first light emitting device 401-1 correspondingly to one line is data 0. The image controller 700 makes the chip select signal cs_x Low by the number of clock cycles ΔT0 necessary to transfer the image data for driving the lower electrodes in the light emitting device 401-1 correspondingly to one line. In this embodiment, image data corresponding to one line is transferred per one clock cycle, and ΔT0 is 748 cycles. Incidentally, a constitution in which image data of a plurality of lower electrodes are transferred in one cycle or a constitution in which image data corresponding to one lower electrode are transferred in a plurality of cycles may also be employed.

The chip select signal generating portion 803 built in the light emitting device 401-1 outputs the chip select signal cs_x_1 obtained by delaying the chip select signal cs_x inputted to the light emitting device 401-1 by ΔT1 cycle. Here, ΔT1 is a value obtained by adding a delay necessary for generating the chip select signal to ΔT0. In this embodiment, 2 cycles are required for signal generation, so that ΔT1=750 cycles is set. By doing so, the chip select signal generating portion 803 is capable of generating the chip select signal cs_x_1 so as not to become Low simultaneously with cs_x. The chip select signal generating portions 803 built in other light emitting device 401-2 and later also similarly generate new chip select signals in a manner such that the chip select signal inputted from the light emitting device in the previous stage does not become Low simultaneously with the inputted chip select signal, and sequentially transfers the clock signals to the light emitting device in the post stage. That is, each light emitting device samples the image data by the inputted chip select signal and delays the inputted chip select signal by a predetermined amount, and delivers the chip select signal to the light emitting device in the post stage. As a result of this, the respective chip select signals successively become Low in the order of cs_x→cs_x_1→cs_x2→ . . . →cs_x_19. Further, the cycle ΔT2 of the line synchronization signal lsync_x is a value larger than a time until cs_x_19 is inputted to the light emitting device 401_20, in order to send the image data to all the light emitting devices 401. When the cycle ΔT2 is represented by a formula, the following is satisfied.

$$\Delta T2 \geq \Delta T1 \times 20$$

The image controller portion 700 carries out control so that a section in which cs_x_19 becomes Low and a section in which cs_x becomes Low do not overlap with each other, and sends the image data data 0 to data 19 to the image data signal line 707 in conformity to the respective chip select signals with an interval of each (ΔT1-ΔT0) cycle. The chip select signals are also inputted to the image data storing portion 804 built in each light emitting device 401. The image data storage portion 804 is capable of receiving the image data from the image data signal 707 by inputting the chip select signal of the Low level thereto. That is, in one cycle of Lsyncx, only one light emitting device from the light emitting device 401-1 to the light emitting device 401-20 is capable of receiving the image data from the image controller 700 via the image data (signal line) 707. The chip select signals are sequentially delivered from the light emitting device 401-1 to the light emitting device 401-20, whereby the image controller portion 700 is capable of dividedly sending image data toward each light emitting device by the common image data signal line 707 and one chip select signal line.

As described above, the light emitting devices are cascade-connected to each other by the chip select signals, so that even when a bit width of the image data signal line is made large, an increase in the number of signal lines can be suppressed.

Modified Embodiment

Figure 22:
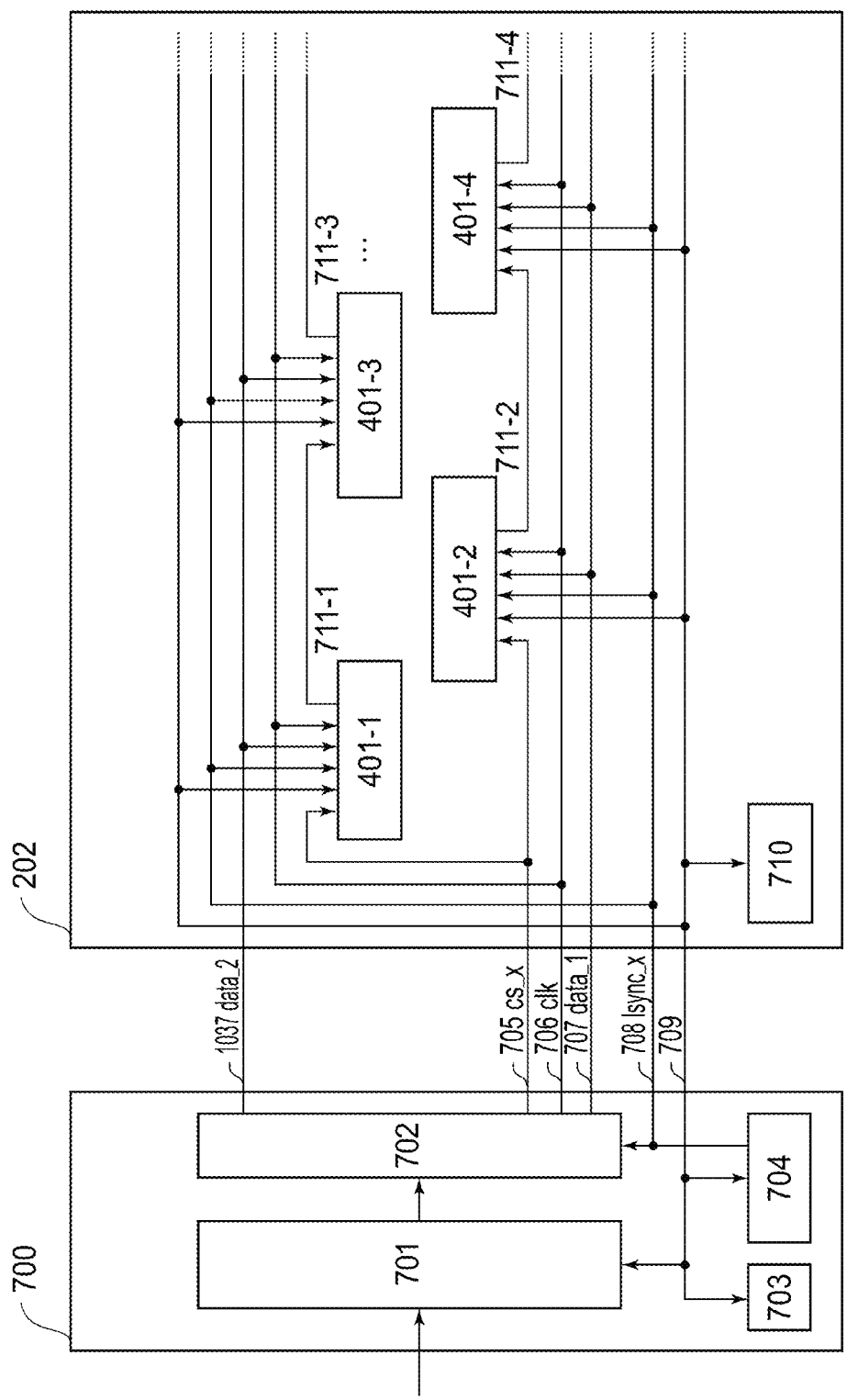
FIG. 22 is a block diagram showing a modified example of an image controller portion and a printed board.
Figure 23:
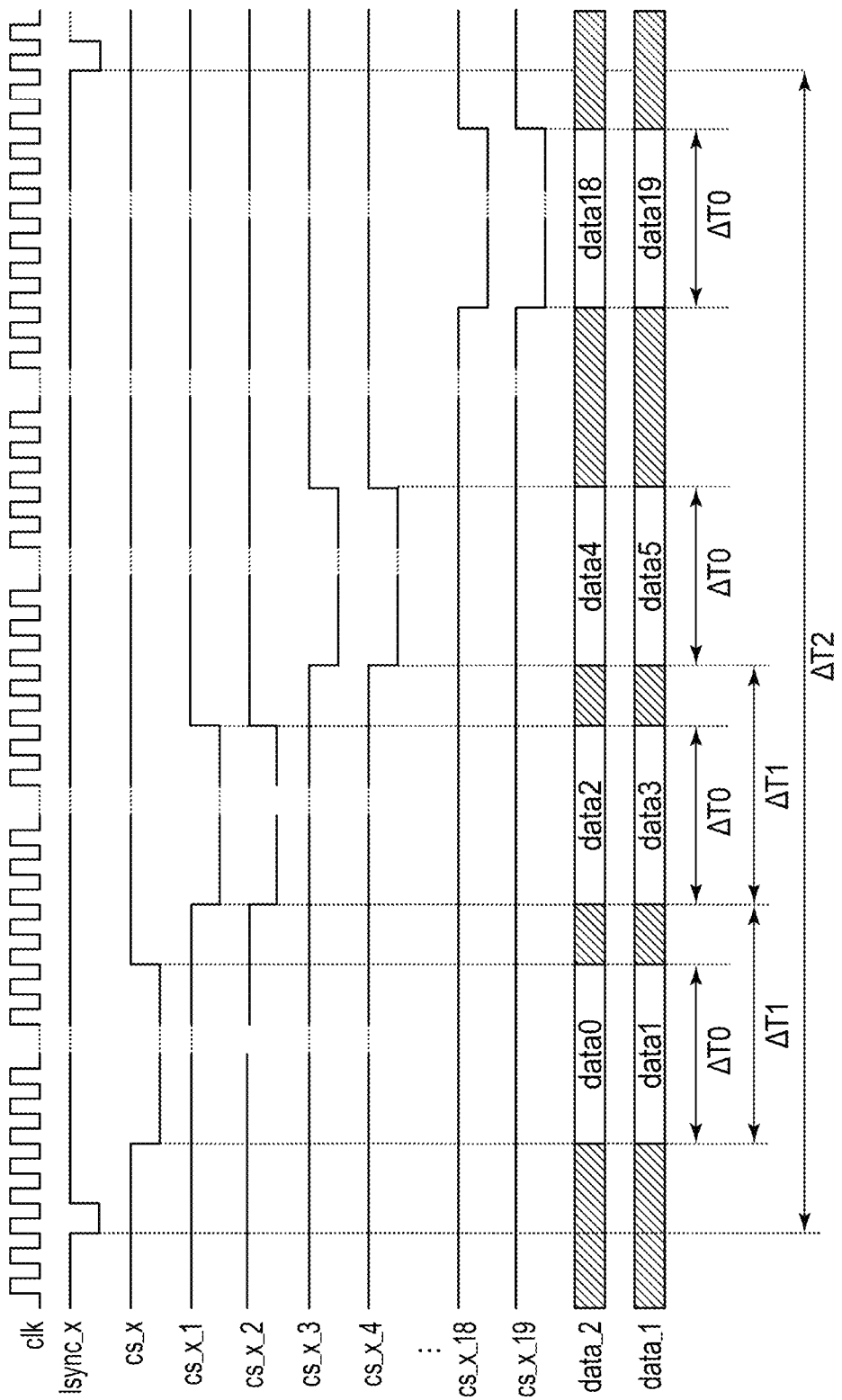
FIG. 23 is a timing chart for illustrating a chip select signal as a modified embodiment.

A modified embodiment of the embodiment 4 will be described using FIG. 22 and FIG. 23. In FIG. 22, a block diagram of the image controller portion 700 and the printed board 202 in the modified embodiment is shown. A difference from FIG. 6 in the embodiment 1 is that in addition to the image data signal line 707 (hereinafter, referred to as a first image data signal line or a first signal line for distinction), second image data signal line 1307 (second signal line) is additionally outputted from the chip data converting portion 702 and that signal line connection to the light emitting device 401 in the printed board 202 is employed.

In the chip data converting portion 702, the image data corresponding to one line is divided in synchronism with the line synchronization signal generated in the synchronization signal generating portion 704, into first image data for the light emitting devices 401-2, 401-4, . . . disposed on the lower side of the printed board 202 in FIG. 22 and second image data for the light emitting devices 401-1, 401-3, . . . disposed on the upper side of the printed board 202 in FIG. 22, and sends each image data together with the clock signal and the chip select signals to the printed board 202. Incidentally, the first image data and the second image data are individually sent. Other constitutions of the image controller portion 700 are similar to those in the embodiment 1.

Next, a constitution of the printed board 202 will be described. The head information storage portion 710 is similar to that in the first embodiment. The clock signal line 706, the line synchronization signal line 708, and the communication signal line 709 are connected to all the light emitting devices 401. The first image data signal line 707 is connected to the light emitting devices 401-2, 401-4, . . . disposed on the lower side on the printed board 202 in the figure. That is, the first image data signal line 707 is used in common to the light emitting devices 401-2, 401-4, . . . for sending the image data. The second image data signal line 1307 is connected to the light emitting devices 401-1, 401-3, . . . disposed on the upper side on the printed board 202 in the figure. That is, the second image data signal line 707 is used in common to the light emitting devices 401-1, 401-3, . . . for sending the image data. Incidentally, the light emitting devices 401-2, 401-4, . . . are a first light emitting device group, and the light emitting devices 401-1, 401-3, . . . are a second light emitting device group.

The upper-side light emitting devices are cascade-connected to each other in a manner such that the chip select signal line 705 is connected to an input of the light emitting device 401-1 and an output of the light emitting device 401-1 is connected to an input of the light emitting device 401-3, via the signal line 711-1, . . . . Further, the lower-side light emitting devices are cascade-connected to each other in a manner such that the chip select signal line 705 is also connected to an input of the light emitting device 401-2 and an output of the light emitting device 401-2 is connected to an input of the light emitting device 401-4 via the signal line 711-2, . . . . Operations of the respective light emitting devices 401 are similar to those in the embodiment 1.

Next, image data transfer from the image controller portion 700 to the light emitting devices 401 in this embodiment will be described. FIG. 23 is a timing chart showing a relationship between the chip select signals cs_x, cs_x_1 to cs_x_19, the clock signal clk, the line synchronization signal lsync_x, the first image data signal data_1, and the second image data signal data_2. In FIG. 23, cs_x represents the chip select signals inputted to the light emitting device 401-1 and the light emitting device 401-2 via the signal line 705 of FIG. 22, cs_x_1 represents the chip select signal inputted to the light emitting device 401-3 via the signal line 711-1 of FIG. 22, cs_x_2 represents the chip select signal inputted to the light emitting device 401-4 via the signal line 711-2 of FIG. 22, cs_x_3 represents the chip select signal inputted to the light emitting device 401-5 via the signal line 711-3 of FIG. 23, cs_x_4 represents the chip select signal inputted to the light emitting device 401-6 via the signal line 711-4 of FIG. 23, cs_x_18 represents the chip select signal inputted to the light emitting device 401-19, and cs_x_19 represents the chip select signal inputted to the light emitting device 401-20, respectively. The notations of the image data are similar to those in FIG. 12.

Generation of a Low width ΔT0 of the chip select signal cs_x and the chip select signals in the light emitting devices 401 is similar to that in the embodiment 1. In this embodiment, the chip select signal cs_x is inputted to the light emitting devices 401-1 and 401-2 and is cascade-counted on each of the upper side and the lower side. As a result of this, a system in which the respective chip select signals sequentially become Low in the order of cs_x cs_x_1→ cs_x_3→ . . . →cs_x_19 and a system in which the respective chip select signals sequentially become Low in the order of cs_x→cs_x_2→cs_x_4→ . . . →cs_x_18 proceed in parallel, so that the same chip select signals generate two by two.

In the cycle ΔT2 of the line synchronization signal lsync_x, the number of stages of the cascade connection becomes half compared with the embodiment 1, and therefore, constraint is as follows.

$$\Delta T2 \geq \Delta T1 \times 10$$

The image controller portion 700 carries out control so that a section in which the chip select signals cs_x_18 and cs_x_19 become Low and a section in which the chip select signal cs_x subsequently becomes Low do not overlap with each other, and sends the image data data 1, data 3, . . . , data 19 to the first image data signal line 707 and sends the image data data 0, data 2, . . . , data 18 to the second image data signal line 1307 with an interval of each (ΔT1-ΔT0) cycle, in conformity to the chip select signals.

As described above, a plurality of systems of the cascade connection of the light emitting devices 401 by the chip select signals are provided, and the image data signal lines are provided in parallel, so that a lower limit constraint of the cycle of the line synchronization signal lsync_x is alleviated and productivity can be enhanced. Incidentally, in this embodiment, the light emitting devices 401 are divided into the two systems, but may also be divided into three systems or four systems.

INDUSTRIAL APPLICABILITY

According to the present invention, there is provided an image forming apparatus of an electrophotographic type using an exposure head including an LED or the like.

The present invention is not restricted to the foregoing embodiments, but can be variously changed and modified without departing from the spirit and the scope of the present invention. Accordingly, the following claims are attached for making public the scope of the present invention.

This application claims the Conventional Priority from Japanese Patent Application 2019-152969 filed Aug. 23, 2019, Japanese Patent Application 2019-152970 filed Aug. 23, 2019 and Japanese Patent Application 2020-124707 filed Jul. 21, 2020, all disclosure of which are incorporated by reference herein.

The invention claimed is:

1. An image forming apparatus comprising:
a photosensitive member;
a substrate on which a plurality of light emitting chips are arranged in a longitudinal direction of the substrate, the plurality of light emitting chips being configured to emit light that is deposited on a surface of the photosensitive member, each of the plurality of light emitting chips including:
a silicon wafer;
a laminar member formed on the silicon wafer, the laminar member including a first electrode layer that includes a plurality of electrodes, a second electrode layer through which light is transmittable, and a light emitting layer formed in a layer between the first electrode layer and the second electrode layer in a direction perpendicular to a surface of the silicon wafer on which the laminar member is formed, the light emitting layer being configured to emit light by a voltage being applied to the plurality of electrodes;
a first wire bonding pad; and
a driving circuit including a digital-analog-converter configured to generate the voltage as an analog signal based on a digital value corresponding to an amount of light to be emitted from the light emitting layer, the driving circuit applying the voltage, generated by the digital-analog-converter, to each of the plurality of electrodes based on image data for controlling emission and non-emission of the light; and
a controller configured to output the image data to the driving circuit via the first wire bonding pad, a second wire bonding pad disposed on the substrate, and a wire connecting the first wire bonding pad and the second wire bonding pad.

2. An image forming apparatus according to claim 1, wherein the first electrode layer includes the plurality of electrodes arranged along the longitudinal direction of the substrate.

3. An image forming apparatus according to claim 1, wherein the plurality of light emitting chips is arranged in a staggered state along the longitudinal direction of the substrate.

4. An image forming apparatus according to claim 1, wherein the driving circuit includes a register portion for storing the digital value, and
wherein the digital-analog-converter generates the voltage based on the digital value outputted from the register portion.

5. An image forming apparatus according to claim 1, wherein the first electrode layer is formed in a layer on the silicon wafer, the light emitting layer is formed in a layer on the first electrode layer in the direction perpendicular to the surface of the silicon wafer, and the second electrode layer is formed in a layer on the light emitting layer in the direction perpendicular to the surface of the silicon wafer.

6. An image forming apparatus according to claim 1, wherein the laminar member is sealed by a sealing material.

7. An image forming apparatus according to claim 1, wherein the first electrode layer includes the plurality of electrodes,
wherein one different area of the plurality of electrodes is 90% or larger to one pixel area in a resolution of an image formed on a recording material by the image forming apparatus.

8. An image forming apparatus according to claim 1, wherein the first electrode layer includes the plurality of electrodes, and
wherein one different area of the plurality of electrodes is 110% or smaller to one pixel area in a resolution of an image formed on a recording material by the image forming apparatus.

9. An image forming apparatus according to claim 1, wherein the first electrode layer is formed separately on the silicon wafer, and the light emitting layer is formed in an area on the silicon wafer where the first electrode layer is not formed.

10. An image forming apparatus according to claim 1, wherein the first electrode layer includes the plurality of electrodes,
wherein the driving circuit includes a pulse signal generating circuit configured to generate a pulse signal corresponding to each of the plurality of electrodes based on the image data, and
wherein the driving circuit supplies the voltage generated by the digital-analog-converter in response to the pulse signal to each of the plurality of electrodes.

11. An image forming apparatus according to claim 10, wherein the driving circuit includes a shift register including a plurality of flip flop circuits which correspond to the plurality of electrodes, respectively, and which are for storing the image data, and the driving circuit includes a register including a plurality of flip flop circuits which correspond to the plurality of electrodes, respectively, and which are individually connected to the plurality of flip flop circuits, respectively, of the shift register, and wherein the pulse signal generating portion generates the pulse signal on the basis of the image data stored in the flip flop circuits of the register.

12. An image forming apparatus according to claim 11, wherein the controller generates a clock signal and a line synchronization signal, wherein the shift register samples the image data outputted by the controller in synchronism with the clock signal and shifts the image data in the plurality of flip flop circuits thereof, and wherein the image data stored in the flip flop circuits, respectively, corresponding to the plurality of electrodes of the shift register are transferred to the flip flop circuits of the register depending on the line synchronization signal.

13. An image forming apparatus according to claim 1, wherein the controller and the plurality of light emitting chips are connected by a common signal line for transmitting the image data from the controller to the plurality of light emitting chips, and wherein the controller outputs an enabling signal for enabling sampling of the image data to one light emitting chip of the plurality of light emitting chips, and each of the plurality of light emitting chips successively delivers the enabling signal in a delayed manner by using the one light emitting chip as a starting point.

14. An image forming apparatus according to claim 1, wherein the plurality of light emitting chips are divided into a first light emitting chip group connected to the controller by a common signal line for transmitting the image data and a second light emitting chip group connected to the controller by a common second signal line for transmitting the image data, and wherein the controller outputs an enabling signal for enabling sampling of the image data to each of one light emitting chip of the plurality of light emitting chips included in the first light emitting chip group and one light emitting chip of the plurality of light emitting chips included in the second light emitting chip group, and each of the plurality of light emitting chips included in each of the light emitting chip groups successively delivers the enabling signal in a delayed manner by using the one light emitting chip of the plurality of light emitting chips included in the first light emitting chip group and the one light emitting chip of the plurality of light emitting chips included in the second light emitting chip group as a starting point.

15. An image forming apparatus according to claim 1, wherein the light emitting layer is an organic EL.

* * * * *